(12) United States Patent
Choi et al.

(10) Patent No.: US 12,490,620 B2
(45) Date of Patent: Dec. 2, 2025

(54) ORGANIC LIGHT EMITTING DISPLAY DEVICE INCLUDING OVERCOAT LAYER HAVING COLORED PARTICLES

(71) Applicant: LG DISPLAY CO., LTD., Seoul (KR)

(72) Inventors: Wonjin Choi, Seoul (KR); ChaeKyung Lim, Seoul (KR)

(73) Assignee: LG Display Co., Ltd (KR)

( * ) Notice: Subject to any disclaimer, the term of this patent is extended or adjusted under 35 U.S.C. 154(b) by 500 days.

(21) Appl. No.: 17/942,198

(22) Filed: Sep. 12, 2022

(65) Prior Publication Data
US 2023/0078264 A1 Mar. 16, 2023

(30) Foreign Application Priority Data
Sep. 16, 2021 (KR) .................. 10-2021-0124395
May 31, 2022 (KR) .................. 10-2022-0067239

(51) Int. Cl.
| | |
|---|---|
| H10K 59/38 | (2023.01) |
| H10K 50/844 | (2023.01) |
| H10K 59/12 | (2023.01) |
| G02B 5/20 | (2006.01) |

(52) U.S. Cl.
CPC .......... H10K 59/38 (2023.02); H10K 50/844 (2023.02); H10K 59/12 (2023.02); G02B 5/201 (2013.01)

(58) Field of Classification Search
CPC .... H10K 59/38; H10K 59/12; H10K 59/8791; H10K 59/8792; G02G 5/201; G02G 5/223
See application file for complete search history.

(56) References Cited

U.S. PATENT DOCUMENTS

| | | | |
|---|---|---|---|
| 11,244,986 B2* | 2/2022 | Bae ...................... | H10K 85/731 |
| 2003/0001992 A1* | 1/2003 | Kawase ............... | B41J 2/14233 |
| | | | 349/106 |
| 2010/0066949 A1* | 3/2010 | Utsumi ............. | G02F 1/133528 |
| | | | 349/99 |
| 2018/0120631 A1* | 5/2018 | Lee ................... | G02F 1/133528 |
| 2018/0151628 A1* | 5/2018 | Park ...................... | H10K 59/35 |
| 2018/0159080 A1* | 6/2018 | Shimoyama ..... | H10K 59/80521 |
| 2018/0197921 A1* | 7/2018 | Kim ...................... | H10K 59/38 |

(Continued)

FOREIGN PATENT DOCUMENTS

| | | | | |
|---|---|---|---|---|
| KR | 20170010931 A | * | 2/2017 | ......... H01L 27/3225 |
| KR | 20180082661 A | | 7/2018 | |

OTHER PUBLICATIONS

Office Action in Korean Appln. No. 10-2022-0067239, mailed on Oct. 17, 2025, 29 pages (with English translation).

*Primary Examiner* — Ida M Soward
(74) *Attorney, Agent, or Firm* — Fish & Richardson P.C.

(57) ABSTRACT

An organic light emitting display panel and an organic light emitting display device include an encapsulation layer positioned on a substrate where an organic light emitting element is disposed, a plurality of color filters positioned on the encapsulation layer, an overcoat layer in an opaque color, positioned on the plurality of color filters and including a plurality of colored particles, and an adhesive layer positioned on the overcoat layer and having reduced external light reflectance and power consumption by adjusting the thickness of the overcoat layer or the thickness of the color filter layer for each subpixel and allowing the overcoat layer to differ in color from the plurality of color filter layers.

20 Claims, 12 Drawing Sheets

(56) References Cited

U.S. PATENT DOCUMENTS

| | | | | |
|---|---|---|---|---|
| 2018/0341147 A1* | 11/2018 | Sugitani | ............ | G02F 1/133617 |
| 2018/0356678 A1* | 12/2018 | Kim | .................. | G02F 1/133516 |
| 2019/0011758 A1* | 1/2019 | Lee | ........................ | H10K 71/18 |
| 2019/0219875 A1* | 7/2019 | Jung | .................. | G02F 1/133514 |
| 2019/0273122 A1* | 9/2019 | Iwasaki | ................ | H10K 50/841 |
| 2020/0081292 A1* | 3/2020 | Park | ........................ | H05B 33/10 |
| 2021/0028327 A1* | 1/2021 | Lin | ..................... | H01L 25/0753 |

\* cited by examiner

ORGANIC LIGHT EMITTING DISPLAY DEVICE INCLUDING OVERCOAT LAYER HAVING COLORED PARTICLES

CROSS-REFERENCE TO RELATED APPLICATIONS

This application claims the priorities of Korean Patent Application No. 10-2021-0124395, filed on Sep. 16, 2021 and Korean Patent Application No. 10-2022-0067239, filed on May 31, 2022, which are hereby incorporated by reference in their entirety.

BACKGROUND

Field of the Present Disclosure

The present disclosure relates to an organic light emitting display panel and an organic light emitting display device including the same.

Description of the Background

The recent trend of preference to large-scale display devices leads to increasing demand for flat display devices that occupy less space. Among such flat display devices, the organic light emitting display (OLED) devices including organic light emitting diodes is attracting attention, and its technology is rapidly developing.

The organic light emitting display devices have many advantages, such as forming devices on a transparent substrate, low-voltage driving (10V or less) and resultant less power consumption, and high color purity. Further, the organic light emitting diode may display red, green, and blue, so that the organic light emitting display is rapidly emerging as a next-generation display device after the liquid crystal display (LCD) while replacing the LCD for mobile devices.

An OLED display device includes polarizing plates including a circularly polarizing plate and a linearly polarizing plate, through which it implements true black and reduces external light reflection to enhance visibility.

However, OLED display devices adopting a polarizing plate have problems in manufacturing cost and reduction in brightness.

SUMMARY

Accordingly, the present disclosure is to provide an organic light emitting display panel with reduced external light reflectance despite lack of a polarizing plate and an organic light emitting display device including the same.

The present disclosure is also to provide an organic light emitting display panel with a structure capable of reducing power consumption thanks to enhanced light emission efficiency of organic light emitting elements and an organic light emitting display device including the same.

In an aspect of the present disclosure, a organic light emitting display device includes a substrate, an organic light emitting element disposed on the substrate, an encapsulation layer disposed on the substrate where the organic light emitting element is disposed, a color filter layer disposed on the encapsulation layer, an overcoat layer in an opaque color, disposed on the color filter layer and including colored particles, and an adhesive layer disposed on the overcoat layer, wherein the overcoat layer differs in color from the color filter layer and the adhesive layer, wherein a first subpixel, a second subpixel, and a third subpixel are disposed in an active area, wherein the color filter layer includes a first color filter disposed on the first subpixel, a second color filter disposed on the second subpixel, and a third color filter disposed on the third subpixel, and wherein at least one step is formed in a boundary area between different color filters.

In the organic light emitting display device of the present disclosure, the first color filter includes first particles, the second color filter includes second particles different from the first particles, and the third color filter includes third particles different from the first particles and the second particles.

In the organic light emitting display device of the present disclosure, the colored particles include at least one type of particles among the first to third particles.

In the organic light emitting display device of the present disclosure, the second color filter includes at least one of a green pigment or a green dye, and a thickness of the second color filter is equal to or smaller than a thickness of the first color filter and a thickness of the third color filter.

In the organic light emitting display device of the present disclosure, the first color filter includes at least one of a red pigment or a red dye, and the third color filter includes at least one of a blue pigment or a blue dye.

In the organic light emitting display device of the present disclosure, the thickness of the third color filter is equal to or larger than a thickness of the first color filter.

In the organic light emitting display device of the present disclosure, when a thickness of the first color filter is h1, the thickness of the second color filter is h2, and the thickness of the third color filter is h3, $$0.5 \leq \frac{h2}{h1} \leq 1.0 \quad \text{(Equation 1)}$$

$$1.0 \leq \frac{h3}{h1} \leq 1.5 \quad \text{(Equation 2)}$$

Equation 1 and Equation 2 are met.

In the organic light emitting display device of the present disclosure, a transmittance of the overcoat layer at a wavelength of 430 nm is 60% or more and 90% or less.

In the organic light emitting display device of the present disclosure, the colored particles included in the overcoat layer include one or more of non-metallic pigments including carbon black, lactam black, aniline black, perylene black, and acetylene black, and a content of the colored particles is 0.3 wt % or more.

In the organic light emitting display device of the present disclosure, the overcoat layer has a flatness of 90% or more.

In the organic light emitting display device of the present disclosure, the adhesive layer has a transparent color and the overcoat layer has a gray color.

In the organic light emitting display device of the present disclosure, the adhesive layer has a black color, and the overcoat layer has a a color than black.

In the organic light emitting display device of the present disclosure, a fourth subpixel is further disposed in the active area, and a thickness of the overcoat layer in an area corresponding to the fourth subpixel is larger than a thickness of the overcoat layer in an area corresponding to the first to third subpixels.

In the organic light emitting display device of the present disclosure, no color filter is disposed in the fourth subpixel, or a thickness of a color filter disposed in the fourth subpixel is smaller than thicknesses of the first to third color filters.

In the organic light emitting display device of the present disclosure, when the thickness of the overcoat layer in the area corresponding to the fourth subpixel is h4, and the thickness of the overcoat layer in the area corresponding to the first to third subpixels is h5, $$1.5 \le \frac{h4}{h5} \le 6.0 \quad \text{(Equation 3)}$$

is met.

In the organic light emitting display device of the present disclosure, a transmittance of the overcoat layer in the area corresponding to the fourth subpixel is 40% or more and 90% or less.

In the organic light emitting display device of the present disclosure, a fourth subpixel is further disclosed in the active area, and the colored particles included in the overcoat layer include one or more of non-metallic pigments including carbon black, lactam black, aniline black, perylene black, and acetylene black, and a content of the colored particles is 0.1 wt % or more.

In the organic light emitting display device of the present disclosure, a fourth subpixel is further disposed in the active area, and the overcoat layer has a flatness of 90% or more.

In the organic light emitting display device of the present disclosure, a fourth subpixel is further disposed in the active area, and the first color filter includes first particles, the second color filter includes second particles different from the first particles, and the third color filter includes third particles different from the first particles and the second particles.

In the organic light emitting display device of the present disclosure, a fourth subpixel is further disposed in the active area, and the colored particles include at least one type of particles among the first to third particles.

Various aspects of the present disclosure provide an organic light emitting display panel with reduced external light reflectance despite lack of a polarizing plate by disposing the color filter layer on the encapsulation layer and the overcoat layer containing colored particles on the color filter layer and an organic light emitting display device including the same.

Various aspects of the present disclosure provides an organic light emitting display panel which may reduce power consumption and manufacturing costs by adjusting the thickness of the color filter for each subpixel to thereby reduce the reflectance to an equivalent performance or less and an organic light emitting display device including the same.

Various aspects of the present disclosure provides an organic light emitting display panel which may reduce power consumption and manufacturing costs by adjusting the thickness of the overcoat layer containing colored particles for each subpixel to thereby reduce the reflectance to an equivalent performance or less and an organic light emitting display device including the same.

According to various aspects of the present disclosure, in the flexible display device and foldable display device, stress upon folding due to use of a thick polarizing plate can be reduced, thereby enhancing the reliability of the display panel.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION

Hereinafter, various aspects of the present disclosure are described in detail with reference to the accompanying drawings.

The present disclosure relates to an organic light emitting display device having a color filter layer on an encapsulation layer and, specifically, an organic light emitting display panel adopting an overcoat layer containing colored particles and a thickness-adjusted color filter layer and an organic light emitting display device including the organic light emitting display panel.

Figure 1:
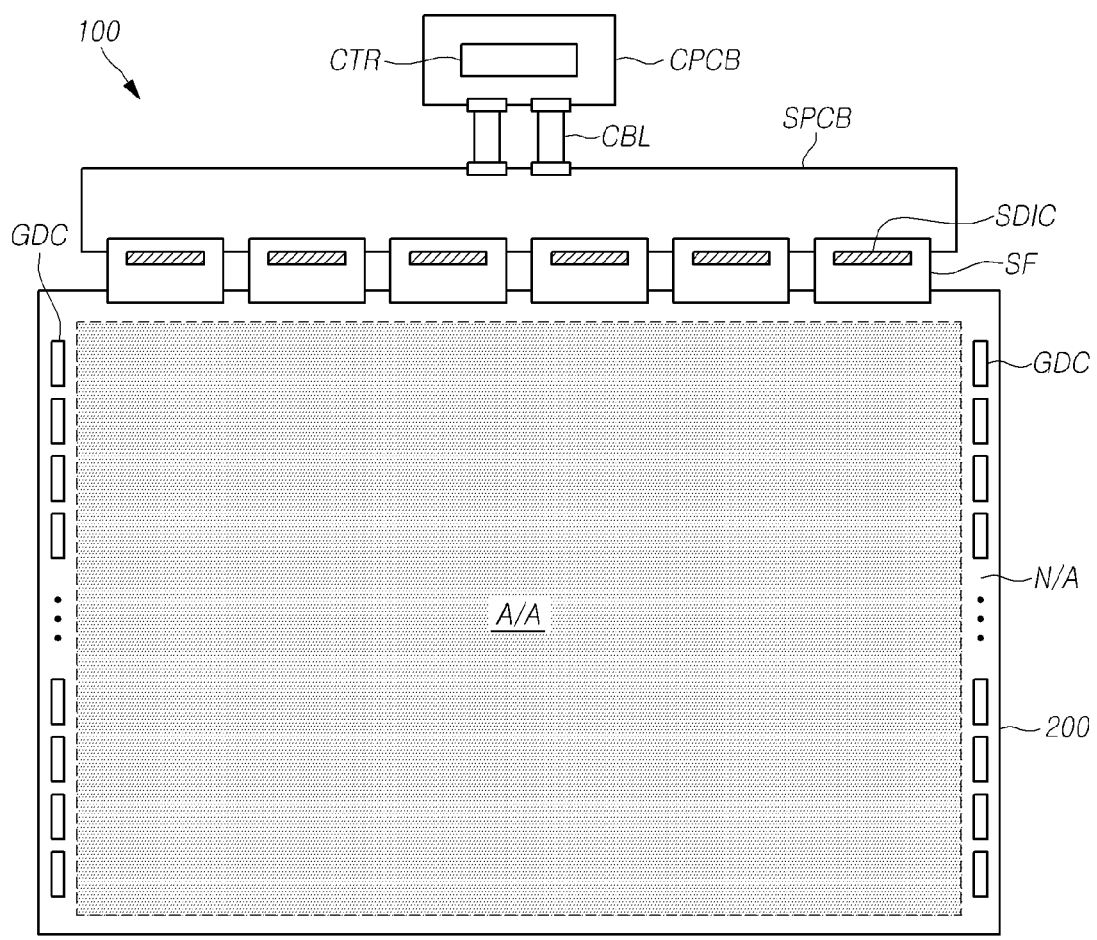
FIG. 1 is a view illustrating an example of system implementation of a display device according to aspects of the present disclosure.

FIG. 1 is a view illustrating an example of system implementation of a display device according to aspects of the present disclosure.

Referring to FIG. 1, in the display device according to aspects of the present disclosure, the data driver DDR may be implemented in a chip on film (COF) type among various types (TAB, COG, COF, etc.), and the gate driver (GDR) may be implemented in a gate in panel (GIP) type among various types (TAB, COG, COF, GIP, etc.).

The data driver DDR may include one or more source driver integrated circuits SDIC. FIG. 1 illustrates an example in which the data driver DDR is implemented with a plurality of source driver integrated circuits SDIC.

When the data driver DDR is implemented in a COF type, each source driver integrated circuit SDIC implementing the data driver DDR may be mounted on the source-side circuit film SF.

One side of the source-side circuit film SF may be electrically connected to the pad portion (a collection of pads) present in the non-active area N/A of the display panel 200.

Lines for electrically connecting the source driver integrated circuit SDIC and the display panel 200 may be disposed on the source-side circuit film SF.

The display device may include one or more source printed circuit boards SPCB for circuit connection between a plurality of source driver integrated circuits SDIC and other devices and a control printed circuit board CPCB for mounting control components and various electric devices.

The other side of the source-side circuit film SF on which the source driving integrated circuit SDIC is mounted may be connected to the one or more source printed circuit boards SPCB.

In other words, one side of the source-side circuit film SF on which the source driving integrated circuit SDIC is mounted may be electrically connected with the non-active area N/A of the display panel 200, and the other side thereof may be electrically connected with the source printed circuit board SPCB.

A controller CTR for controlling the operation of, e.g., the data driver DDR and the gate driver GDR may be disposed on the control printed circuit board CPCB.

Further, a power management integrated circuit PMIC for supplying various voltages or currents to, or controlling various voltages or currents to be supplied to, the display panel, the data driver DDR, and the gate driver GDR, may further be disposed on the control printed circuit board CPCB.

The source printed circuit board SPCB and the control printed circuit board CPCB may be circuit-connected through at least one connection member CBL. The connection member CBL may be, e.g., a flexible printed circuit (FPC) or a flexible flat cable (FFC).

One or more source printed circuit boards SPCB and control printed circuit board CPCB may be integrated into one printed circuit board.

When the gate driver GDR is implemented in a gate in panel (GIP) type, the plurality of gate driving circuits GDC included in the gate driver GDR may directly be formed on the non-active area N/A of the display panel 200.

Each of the plurality of gate driving circuits GDC may output a corresponding scan signal SCAN to a corresponding gate line disposed in the active area A/A in the display panel 200. The active area A/A may mean an area where light is emitted, that is, an area where an image is displayed.

The plurality of gate driving circuits GDC disposed on the display panel may receive various signals (e.g., clock signal, high-level gate voltage VGH, low-level gate voltage VGL, start signal VST, reset signal RST, etc.) necessary to generate the scan signal through the gate driving-related lines disposed in the non-active area N/A.

The gate driving-related lines disposed in the non-active area N/A may be electrically connected with the source-side circuit film SF disposed most adjacent to the plurality of gate driving circuits GDC.

Figure 2:
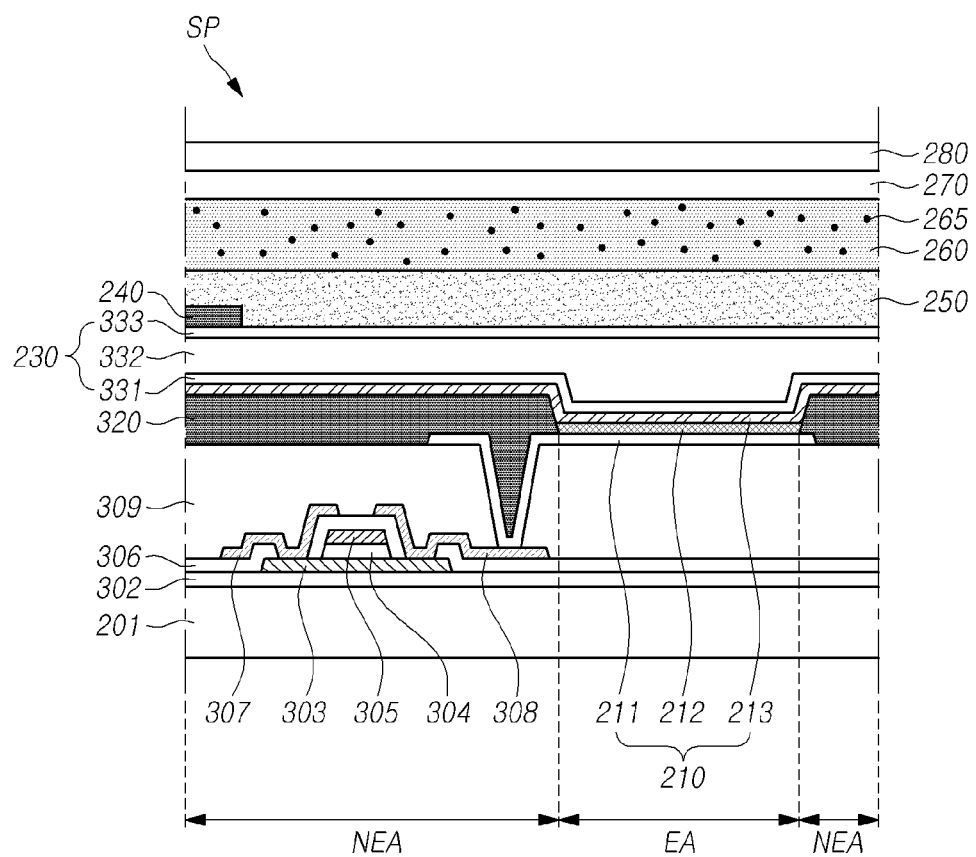
FIG. 2 is a cross-sectional view schematically illustrating a subpixel area of an organic light emitting diode display device according to aspects of the present disclosure.

FIG. 2 is a cross-sectional view schematically illustrating a subpixel area of an organic light emitting diode display device according to aspects of the present disclosure.

Referring to FIG. 2, according to aspects of the present disclosure, the organic light emitting diode display device 100 may include at least one thin film transistor disposed on a substrate 201 and an organic light emitting element 210 disposed on the thin film transistor.

The substrate 201 may be a glass substrate or a plastic substrate. For example, the substrate 201 may be formed of polyimide (PI).

The thin film transistor may include an active layer 303, a gate electrode 305, a source electrode 307, and a drain electrode 308.

The organic light emitting element 210 may include a first electrode 211, a light emitting layer 212, and a second electrode 213.

Specifically, a buffer layer 302 may be disposed on the substrate 201.

The buffer layer 302 may include an inorganic insulating material. For example, the inorganic insulating material may be one selected from among silicon oxide (SiOx), silicon nitride (SiNx), and silicon oxynitride (SiON), but the present disclosure is not limited thereto.

In FIG. 2, the buffer layer 302 has a single-layer structure, but the buffer layer 302 of the present disclosure may have a multi-layer structure.

If the buffer layer 302 has a multi-layer structure, layers including at least two inorganic insulating materials among inorganic materials. For example, the inorganic material may be one selected from among silicon oxide (SiOx), silicon nitride (SiNx), and silicon oxynitride (SiON), may be alternately disposed, but the present disclosure is not limited thereto.

In the following description, for convenience, a structure in which the buffer layer 302 is a single layer is described.

An active layer 303 of a thin film transistor may be disposed on the buffer layer 302.

The active layer 303 may be various types of semiconductor layers. For example, the active layer 303 may be one selected from among an oxide semiconductor, an amorphous silicon semiconductor, and a polysilicon semiconductor, but the present disclosure is not limited thereto. When the active layer 303 is formed of an oxide semiconductor material, a light blocking pattern (not shown) may be formed under the active layer 303. The light blocking pattern prevents light from being incident on the active layer 303 and prevents the active layer 303 from being degraded by the light. Alternatively, the active layer 303 may be formed of polycrystalline silicon and, in this case, both edges of the active layer 303 may be doped with impurities.

A gate insulation film 304 may be disposed on the active layer 303.

The gate insulation film 304 may include an inorganic insulating material. For example, the inorganic insulating material may be one selected from among silicon oxide (SiOx), silicon nitride (SiNx), and silicon oxynitride (SiON), but the present disclosure is not limited thereto.

Figure 3:
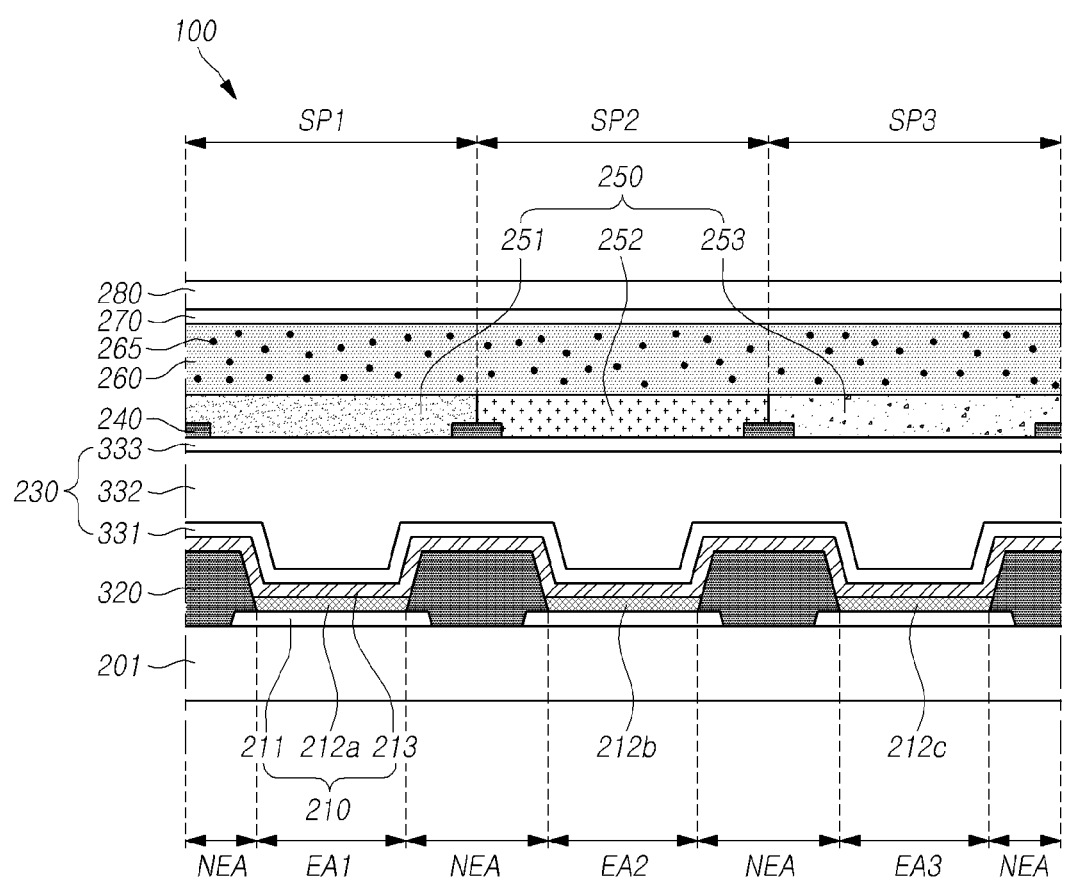
FIG. 3 is a cross-sectional view schematically illustrating a first subpixel, a second subpixel, and a third subpixel disposed in an active area of an organic light emitting display device according to aspects of the present disclosure.

Although FIG. 3 illustrates a structure in which the gate insulation film 304 is disposed on a portion of the upper surface of the active layer 303, the present disclosure is not limited thereto, and the gate insulation film 304 is disposed covering the active layer 303.

A gate electrode 305 of the thin film transistor may be disposed on the gate insulation film 304.

The gate electrode 305 may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but the present disclosure is not limited thereto.

An inter-layer insulation film 306 may be disposed on the gate electrode 305.

The inter-layer insulation film 306 may be formed of an inorganic insulating material, such as silicon oxide (SiOx), silicon nitride (SiNx) or silicon oxynitride (SiON), or an organic insulating material, such as benzocyclobutene or photo-acryl. However, the present disclosure is not limited thereto.

A source electrode 307 and a drain electrode 308 of the thin film transistor may be disposed on the inter-layer insulation film 306 and may be spaced apart from each other.

Or, in aspects of the present disclosure, 307 may be the drain electrode, and 308 may be the source electrode.

The source electrode 307 and the drain electrode 308 may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but the present disclosure is not limited thereto.

Each of the source electrode 307 and the drain electrode 308 may be connected with a portion of the upper surface of the active layer 303 through a contact hole provided in the inter-layer insulating film 306.

The active layer 303, the gate electrode 305, the source electrode 307, and the drain electrode 308 form a thin film transistor Tr, and the thin film transistor Tr functions as a driving element. The thin film transistor Tr has a coplanar structure in which the gate electrode 305, the source electrode 307, and the drain electrode 308 are positioned on the active layer 303.

Alternatively, the thin film transistor Tr may have an inverted staggered structure in which the gate electrode is positioned under the active layer and the source electrode and the drain electrode are positioned over the active layer. In this case, the semiconductor layer may be formed of amorphous silicon.

Although not shown, the gate line and the data line cross each other to define a pixel area, and a switching element connected to the gate line and the data line is further formed. The switching element is connected to the thin film transistor Tr which is the driving element.

Further, a power line may be formed to be spaced apart from, and parallel to, the gate line or the data line, and a storage capacitor may be further configured to keep the voltage of the gate electrode of the thin film transistor Tr, which is the driving element, constant during one frame.

A planarization layer 309 may be disposed on the substrate 201 on which the source electrode 307 and the drain electrode 308 are disposed.

Although not illustrated in the drawings, a protection film including an inorganic insulating material may be further disposed under the planarization layer 309.

A first electrode 211 of the organic light emitting element 210 may be disposed on a portion of the upper surface of the planarization layer 309.

The first electrode 211 may be electrically connected with the drain electrode 308 of the thin film transistor through a contact hole provided in the planarization layer 309. Although FIG. 2 illustrates a structure in which the first electrode 211 is connected with the drain electrode 308 of the thin film transistor, the present disclosure is not limited thereto, and the first electrode 211 may be connected with the source electrode 307 of the thin film transistor.

Although FIG. 2 illustrates a structure in which the first electrode 211 is a single layer, the present disclosure is not limited thereto. For example, the first electrode 211 may have a multi-layer structure of two or more layers.

The first electrode 211 may be formed of a conductive material having a relatively large work function value. For example, the first electrode 211 may be formed of a transparent conductive material being one selected from among indium-tin-oxide (ITO), indium-gallium-zinc-oxide (IGZO), and indium-zinc-oxide (IZO) or may include a reflective electrode.

Specifically, if the first electrode 211 has a single-layer structure, the first electrode 211 may be a reflective electrode including a reflective conductive material.

When the organic light emitting display device 100 of the present disclosure is of a top emission type, a reflective electrode or a reflective layer may be further formed under the first electrode 211. For example, the reflective electrode or the reflective layer may be formed of an aluminum-palladium-copper (APC) alloy.

A bank 320 may be disposed on the planarization layer 309.

The bank 320 may be disposed to overlap a portion of the upper surface of the first electrode 211, particularly to cover an edge of the first electrode. The bank 320 may be disposed to expose a portion of the upper surface of the first electrode 211, corresponding to the pixel area.

The bank 320 may define an emission area EA and a non-emission area NEA in the active area A/A of the organic light emitting diode display device 100. For example, in the active area A/A, the area where the bank 320 is disposed may be the non-emission area NEA, and the area where the bank 320 is not disposed may be the emission area EA.

The bank 320 according to aspects of the present disclosure may be a bank in black or a bank in an opaque color, but the present disclosure is not limited thereto.

A light emitting layer 212 of the organic light emitting element 210 may be disposed on the first electrode 211.

The light emitting layer 212 may be disposed on the upper surface of the first electrode 211 exposed by the bank 320.

Although FIG. 2 illustrates a structure in which the light emitting layer 212 is a single layer, the present disclosure is not limited thereto. The light emitting layer 212 may be formed of a multi-layered organic layer.

For example, although not shown in the drawings, the light emitting layer 212 may include a light emitting material layer positioned between the first and second electrodes 211 and 213, a hole transporting layer positioned between the first electrode 211 and the light emitting material layer, and an electron transporting layer positioned between the second electrode 213 and the light emitting material layer.

The light emitting layer 212 may further include a hole injection layer positioned between the first electrode 211 and the hole transporting layer and an electron injection layer positioned between the second electrode 213 and the electron transporting layer.

The light emitting layer 212 may further include an electron blocking layer positioned between the hole transporting layer and the light emitting material layer and a hole blocking layer positioned between the light emitting material layer and the electron transporting layer.

The light emitting layer 212 may emit light of at least one of red (R), green (G), and blue (B). However, the present disclosure is not limited thereto, and the light emitting layer 212 may emit other colors of light, such as white (W).

A second electrode 213 of the organic light emitting element 210 may be disposed on the substrate 201 on which the light emitting layer 212 is disposed. The second electrode 213 may be positioned on an entire surface of the display area and be formed of a conductive material having a relatively small work function value to be used as a cathode. For example, the second electrode 213 may be formed of aluminum (Al), magnesium (Mg), or an aluminum-magnesium alloy (AlMg). The second electrode 213 may include a transparent conductive material or a semi-transmissive material.

Although FIG. 2 illustrates a structure in which the second electrode 213 is a single layer, the present disclosure is not limited thereto, and the second electrode 213 may have a multi-layer structure of two or more layers.

An encapsulation layer 230 may be disposed on the second electrode 213.

The encapsulation layer 230 may include a first encapsulation layer 331 disposed on the second electrode 213, a second encapsulation layer 332 disposed on the first encapsulation layer 331, and a third encapsulation layer 333 disposed on the second encapsulation layer 332, but is not limited thereto. The first and third encapsulation layers 331 and 333 may include an inorganic insulating material, and the second encapsulation layer 332 may include an organic insulating material.

The first and third encapsulation layers 331 and 333 including the inorganic insulating material may serve to prevent penetration of moisture and oxygen, and the second encapsulation layer 332 including the organic insulating material may serve to delay the movement of a small amount of moisture and oxygen permeated through the third encapsulation layer 333.

Although not illustrated in the drawings, the encapsulation layer 230 may be disposed not only in the active area A/A but also in the non-active area N/A of the organic light emitting diode display device 100.

A black matrix 240 and a color filter layer 250 may be disposed on the encapsulation layer 230.

The black matrix 240 may be disposed in the non-emission area NEA. The black matrix 240 may overlap the bank 320.

A portion of the color filter layer 250 may overlap the bank 320.

The color filter layer 250 may include particles that transmit light of some wavelength bands and absorb light of the remaining wavelength bands. For example, the color filter layer 250 may transmit red (R), green (G), blue (B), and white (W) light. Red (R), green (G), and blue (B) color filters may be formed separately for their respective corresponding pixel areas, and their respective color filter patterns may be disposed to overlap the light emitting layer 212 of the organic light emitting element that emits light. By adopting the color filter layer 250, the organic light emitting display device 100 may realize full color.

An overcoat layer 260 may be disposed on the color filter layer 250.

An adhesive layer 270 may be disposed on the overcoat layer 260.

The overcoat layer 260 may include a plurality of colored particles 265 and thus have an opaque color. For example, the overcoat layer 260 may have a gray color, but the present disclosure is not limited thereto.

The overcoat layer 260 may serve to planarize the surface of the substrate 201 on which the black matrix 240 and the color filter layer 250 are disposed. The planarization layer 309 and the overcoat layer 260 which play similar roles may have different colors.

A cover window 280 may be disposed on the adhesive layer 270.

According to the prior art, the organic light emitting display device 100 typically uses a polarizing plate to reduce external light reflection. However, use of the polarizing plate may increase manufacturing costs and, due to its low light transmittance, reduce the brightness of the organic light emitting display device 100, with the result of deteriorated display quality and increased power consumption. Further, if a polarizing plate is applied, stress increases when bending or folding the display device due to the thickness of the polarizing plate and, due to the polarizing plate's own residual stress, reliability at high temperature and high humidity is not good.

According to aspects of the present disclosure, the organic light emitting display device 100 does not include such a polarizing plate and has the color filter layer 250 disposed on the encapsulation layer 230, thereby reducing external light reflection while enhancing brightness as compared with when a polarizing plate is used.

Further, the organic light emitting display device 100 adopting a polarizing plate has poor bending or folding characteristics. The organic light emitting display device 100 according to aspects of the present disclosure omits a polarizing plate, allowing for easier bending or folding and increased panel reliability.

A color filter layer is disposed on the encapsulation layer, with the polarizing plate omitted, and the reflectance is maintained at an equivalent performance by adjusting the thickness of each color filter layer, and the power consumption of the organic light emitting display device 100 may be reduced by increasing light transmittance.

Further, the organic light emitting diode display device 100 according to the aspects of the present disclosure includes the bank 320 which is opaque. The bank 320 may absorb the light reflected by the plurality of wires and electrodes disposed in the panel, preventing an increase in reflectance due to wiring and electrodes.

Further, since the overcoat layer 260 disposed on the color filter layer 250 also has an opaque color, it is possible to prevent degradation of the visibility of the organic light emitting display device 100 due to reflection of external light. The overall power consumption of the organic light emitting display device may be reduced by enhancing the light transmittance.

FIG. 3 is a cross-sectional view schematically illustrating a first subpixel, a second subpixel, and a third subpixel disposed in an active area of an organic light emitting display device according to aspects of the present disclosure.

Substantially the same configurations and effects as those described above are not repeatedly described below.

Figure 4:
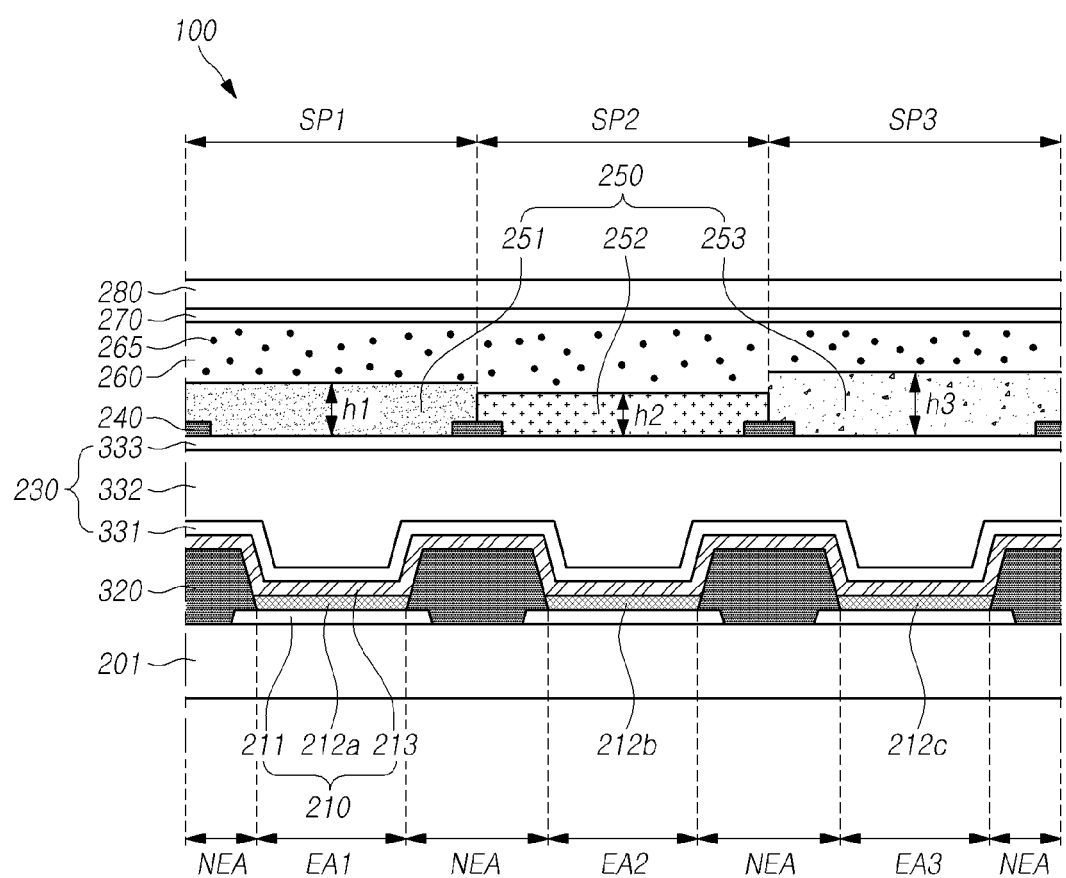
FIG. 4 is a cross-sectional view schematically illustrating a first subpixel, a second subpixel, and a third subpixel disposed in an active area of an organic light emitting display device according to other aspects of the present disclosure.

Although not shown in FIGS. 3 and 4, a plurality of thin film transistors electrically connected to the first electrode 211 of the organic light emitting element 210 may be further disposed on the substrate 201.

Referring to FIG. 3, according to aspects of the present disclosure, the organic light emitting display device 100 may include a plurality of subpixels SP1, SP2, and SP3 provided in the active area (A/A) and a plurality of emission areas EA1, EA2, and EA3.

For example, the organic light emitting display device 100 according to aspects of the present disclosure may include a first subpixel SP1, a second subpixel SP2, and a third subpixel SP3. The first subpixel SP1 may include a first emission area EA1, the second subpixel SP2 may include a second emission area EA2, and the third subpixel SP3 may include a third emission area EA3.

The first emission area EA1, the second emission area EA2, and the third emission area EA3 may be areas emitting light of different colors. The first emission area EA1 may be an area in which red (R) light is emitted, the second light emission area EA2 may be an area in which green (G) light is emitted, and the third light emission area EA3 may be an area in which blue (G) light is emitted, but the present disclosure is not limited thereto.

In this case, the first light emitting layer 212a of the organic light emitting element 210 disposed in the first emission area EA1, the second light emitting layer 212b of the organic light emitting element 210 disposed in the second emission area EA2, and the third light emitting layer 212c of the organic light emitting element 210 disposed in the third emission area EA3 may emit different colors of light. Red (R) light may be emitted from the first light emitting layer 212a, green (G) light may be emitted from the second light emitting layer 212b, and blue (B) light may be emitted from the third light emitting layer 212c. However, the present disclosure is not limited thereto.

The plurality of emission areas EA1, EA2, and EA3 may correspond to an area in which the first electrode 211 that does not overlap the bank 320 is disposed in the active area.

The bank 320 of the organic light emitting display device 100 according to aspects of the present disclosure may be formed of an opaque organic material. For example, the bank 320 may be formed of a black organic material, but the present disclosure is not limited thereto.

The plurality of emission areas EA1, EA2, and EA3 may have a structure surrounded by the non-emission area NEA. The non-emission area NEA may be an area corresponding to an area in which the bank 320 is disposed in the active area A/A.

An encapsulation layer 230 may be disposed on the organic light emitting element 210 to protect the organic light emitting element 210 from foreign objects, such as moisture and oxygen.

A black matrix 240 and a color filter layer 250 may be disposed on the encapsulation layer 230.

The color filter layer 250 may include a plurality of color filters. For example, as illustrated in FIGS. 3 and 4, the color filter layer 250 may include a first color filter 251, a second color filter 252, and a third color filter 253.

One color filter layer disposed to correspond to one emission area may overlap one emission area considering a process margin, and may also overlap a portion of the non-emission area NEA surrounding the emission area. In other words, as illustrated in FIGS. 3 and 5, each of the first color filter 251, the second color filter 252, and the third color filter 253 may overlap an area in which the first electrode 211 and the bank 320 overlap each other.

However, without limitations thereto, the first color filter 251, the second color filter 252, and the third color filter 253 may be disposed to correspond to a first emission area EA1, a second emission area EA2, and a third emission area EA3, respectively, but may not overlap the non-emission area NEA.

Each of the first to third color filters 251, 252, and 253 may be a color filter layer having a different color. For example, the first color filter 251 may be a red (R) color filter, the second color filter 252 may be a green (G) color filter, and the third color filter 253 may be a blue (B) color filter, but the present disclosure is not limited thereto.

The first color filter 251 may include a plurality of first particles that transmit light having a first wavelength band and absorb light of a wavelength band other than the first wavelength band. The first particle may include at least one of a first dye and a first pigment.

The second color filter 252 may include a plurality of second particles that transmit light having a second wavelength band and absorb light of a wavelength band other than the second wavelength band. The second particle may include at least one of a second dye and a second pigment.

The third color filter 253 may include a plurality of third particles that transmit light having a third wavelength band and absorb light of a wavelength band other than the third wavelength band. The third particle may include at least one of a third dye and a third pigment.

The first wavelength band may be a wavelength band for red (R) light, the second wavelength band may be a wavelength band for green (G) light, and the third wavelength band may be a wavelength band for blue (B) light, but the present disclosure is not limited thereto.

An overcoat layer 260 may be disposed on the first to third color filters 251, 252, and 253. The overcoat layer 260 may be disposed on an entire surface of the active area A/A of the organic light emitting display device 100, but the present disclosure is not limited thereto. The overcoat layer 260 may also be disposed on the whole or part of the non-active area N/A.

The overcoat layer 260 may include a plurality of colored particles 265. The plurality of colored particles 265 may include at least one type of particles among the first particles, second particles, and third particles, but the present disclosure is not limited thereto.

For example, the overcoat layer 260 may include the first particles included in the first color filter 251. In this case, the amount of the first particles included in the overcoat layer 260 may be less than the amount of the first particles included in the first color filter 251.

The overcoat layer 260 may include the second particles included in the second color filter 252. In this case, the amount of the second particles included in the overcoat layer 260 may be less than the amount of the second particles included in the second color filter 252.

The overcoat layer 260 may include the third particles included in the third color filter 253. In this case, the amount of the third particles included in the overcoat layer 260 may be less than the amount of the third particles included in the third color filter 253.

The plurality of colored particles 265 included in the overcoat layer 260 according to aspects of the present disclosure may include at least two types of particles among the first to third particles included in the first to third color filters 251, 252, and 253, respectively.

For example, the plurality of colored particles 265 included in the overcoat layer 260 may include a plurality of first and second particles, a plurality of second and third particles, a plurality of first and third particles, or a plurality of first to third particles. The amount of the plurality of colored particles 265 included in the overcoat layer 260 may be less than the amount of the first particles included in the first color filter 251, be less than the amount of the second particles included in the second color filter 252, and be less than the amount of the third particles included in the third color filter 253.

Accordingly, the color of the overcoat layer 260 may be different from the color of each of the first to third color filters 251, 252, and 253.

The plurality of colored particles 265 included in the overcoat layer 260 according to aspects of the present disclosure may include other particles than the first to third particles included in the first to third color filters 251, 252, and 253, respectively. The types of the plurality of colored particles 265 may be three or more, and each type of particles may have a different color.

As such, as the plurality of colored particles 265 are included in the overcoat layer 260, light (external light) incident from the outside of the organic light emitting display device 100 may be absorbed, thereby reducing external light reflectance. In particular, the organic light emitting display device 100 according to aspects of the present disclosure may include a color filter layer 250 and a bank 320 in an opaque color disposed on the encapsulation layer 230. As the overcoat layer 260 including a plurality of colored particles 265 is included, the external light reflectance may be effectively reduced.

Further, since the amount of the plurality of colored particles 265 included in the overcoat layer 260 is less than the amount of the first to third particles included in each of the first to third color filters 251, 252 and 253, it is possible to suppress transmitting only a specific wavelength band of light while absorbing light of the remaining wavelength bands, thereby allowing most of the light from the organic light emitting element 210 to be emitted to the outside.

When the plurality of colored particles 265 included in the overcoat layer 260 include at least two types of particles, the overcoat layer 260 may implement a gray color.

The color of the overcoat layer 260 may be black or may be different from the color of the opaque bank 320.

An adhesive layer 270 and a cover window 280 may be disposed on the overcoat layer 260.

The color of the overcoat layer 260 according to aspects of the present disclosure may be different from the color of the adhesive layer 270.

For example, the adhesive layer 270 may be a transparent adhesive layer 270. In this case, the adhesive layer 270 may be formed of an optically clear adhesive (OCA) layer or an optically clear resin (OCR) layer, but the present disclosure is not limited thereto.

The adhesive layer 270 may be a black adhesive layer 270. When the adhesive layer 270 is black, the adhesive layer 270 may have a state in which black insulative particles are dispersed in an optically clear adhesive (OCA) or an optically clear resin (OCR), but the present disclosure is not limited thereto.

The black adhesive layer 270 may serve to reduce the reflectance of external light of the organic light emitting display device 100 free from a polarizing plate.

However, when the black adhesive layer 270 is applied to prevent the luminance from dropping during operation of the organic light emitting display device 100, the color saturation (or chroma) of the overcoat layer 260 may be low as compared with when the adhesive layer 270 is transparent. In other words, in the organic light emitting display device 100 according to aspects of the present disclosure, the color saturation of the overcoat layer 260 may be adjusted according to the color of the adhesive layer 270.

As shown in FIG. 3, the overcoat layer 260 may include a plurality of colored particles 265 in uniform quantities in an area corresponding to the plurality of subpixels SP1, SP2, and SP3, but the present disclosure is not limited thereto.

FIG. 4 is a cross-sectional view schematically illustrating a first subpixel, a second subpixel, and a third subpixel disposed in an active area of an organic light emitting display device according to other aspects of the present disclosure.

Substantially the same configurations and effects as those described above are not repeatedly described below.

Referring to FIG. 4, according to aspects of the present disclosure, the organic light emitting display device 100 may include a plurality of subpixels SP1, SP2, and SP3 provided in the active area (A/A) and a plurality of emission areas EA1, EA2, and EA3.

For example, the organic light emitting display device 100 according to aspects of the present disclosure may include a first subpixel SP1, a second subpixel SP2, and a third subpixel SP3. The first subpixel SP1 may include a first emission area EA1, the second subpixel SP2 may include a second emission area EA2, and the third subpixel SP3 may include a third emission area EA3.

The first emission area EA1, the second emission area EA2, and the third emission area EA3 may be areas emitting light of different colors. The first emission area EA1 may be an area in which red (R) light is emitted, the second light emission area EA2 may be an area in which green (G) light is emitted, and the third light emission area EA3 may be an area in which blue (G) light is emitted, but the present disclosure is not limited thereto.

In this case, the first light emitting layer 212a of the organic light emitting element 210 disposed in the first emission area EA1, the second light emitting layer 212b of the organic light emitting element 210 disposed in the second emission area EA2, and the third light emitting layer 212c of the organic light emitting element 210 disposed in the third emission area EA3 may emit different colors of light. Red (R) light may be emitted from the first light emitting layer 212a, green (G) light may be emitted from the second light emitting layer 212b, and blue (B) light may be emitted from the third light emitting layer 212c. However, the present disclosure is not limited thereto.

The plurality of emission areas EA1, EA2, and EA3 may correspond to an area in which the first electrode 211 that does not overlap the bank 320 is disposed in the active area.

The bank 320 of the organic light emitting diode display device 100 according to aspects of the present disclosure may be formed of an opaque organic material. For example, the bank 320 may be formed of a black organic material, but the present disclosure is not limited thereto.

The plurality of emission areas EA1, EA2, and EA3 may have a structure surrounded by the non-emission area NEA. The non-emission area NEA may be an area corresponding to an area in which the bank 320 is disposed in the active area A/A.

An encapsulation layer 230 may be disposed on the organic light emitting element 210 to protect the organic light emitting element 210 from foreign objects, such as moisture and oxygen.

A black matrix 240 and a color filter layer 250 may be disposed on the encapsulation layer 230.

The color filter layer 250 may include a plurality of color filter layers. For example, as illustrated in FIGS. 3 and 4, the color filter layer 250 may include a first color filter 251, a second color filter 252, and a third color filter 253.

One color filter layer disposed to correspond to one emission area may overlap one emission area considering a process margin, and may also overlap a portion of the non-emission area NEA surrounding the emission area. In other words, as illustrated in FIG. 4, each of the first color filter 251, the second color filter 252, and the third color filter 253 may overlap an area in which the first electrode 211 and the bank 320 overlap each other.

However, without limitations thereto, the first color filter 251, the second color filter 252, and the third color filter 253 may be disposed to correspond to a first emission area EA1, a second emission area EA2, and a third emission area EA3, respectively, but may not overlap the non-emission area NEA.

Each of the first to third color filters 251, 252, and 253 may be a color filter layer having a different color. For example, the first color filter 251 may be a red (R) color filter layer, the second color filter 252 may be a green (G) color filter layer, and the third color filter 253 may be a blue (B) color filter layer, but the present disclosure is not limited thereto.

The first color filter 251 may include a plurality of first particles that transmit light having a first wavelength band and absorb light of a wavelength band other than the first wavelength band. The first particle may include at least one of a first dye and a first pigment.

The second color filter 252 may include a plurality of second particles that transmit light having a second wavelength band and absorb light of a wavelength band other than the second wavelength band. The second particle may include at least one of a second dye and a second pigment.

The third color filter 253 may include a plurality of third particles that transmit light having a third wavelength band and absorb light of a wavelength band other than the third wavelength band. The third particle may include at least one of a third dye and a third pigment.

The first wavelength band may be a wavelength band for red (R) light, the second wavelength band may be a wavelength band for green (G) light, and the third wavelength band may be a wavelength band for blue (B) light, but the present disclosure is not limited thereto.

The color filter layer may have a different thickness for each area. The first to third color filters 251, 252, and 253 may have the same thickness, but to enhance the light transmittance thereof, at least one color filter layer may have a different thickness.

For example, the thickness of the first color filter may be h1, the thickness of the second color filter may be h2, and the thickness of the third color filter may be h3. The thickness h1 of the first color filter may be larger than or equal to the thickness h2 of the second color filter. The thickness h2 of the second color filter may be different from the thicknesses of the color filter layers corresponding to the remaining subpixels. For example, the thickness h2 of the second color filter may be equal to or smaller than the thickness h1 of the first color filter and the thickness h3 of the third color filter. The thickness h3 of the third color filter may be different from the thicknesses of the color filter layers corresponding to the remaining subpixels. For example, the thickness h3 of the third color filter may be larger than or equal to the thickness h1 of the first color filter and the thickness h2 of the second color filter.

Specifically, the thickness h1 of the first color filter, the thickness h2 of the second color filter, and the thickness h3 of the third color filter may meet the following equations.

$$0.5 \leq \frac{h2}{h1} \leq 1.0 \quad \text{(Equation 1)}$$

$$1.0 \leq \frac{h3}{h1} \leq 1.5 \quad \text{(Equation 2)}$$

The thickness of each color filter layer may be at least 1 μm or more, and may be 6 μm or less. If the thickness of the color filter layer is smaller than 1 μm, the content of pigment or dye constituting the color filter layer increases, and the own curing rate of the material decreases. If the thickness of the color filter layer is larger than 6 μm, the processability deteriorates due to the large thickness upon manufacture or a color filter layer pattern is difficult to form, rendering it hard to implement the pattern in a desired shape.

More specifically, the thickness h1 of the first color filter may be 2 μm to 5 μm, the thickness h2 of the second color filter may be 1 to 5 μm, and the thickness h3 of the third color filter may be 2 μm to 6 μm.

TABLE 1

|  | R/G/B color filter layer thickness ratio | White power consumption (mW) | reflectance |
|---|---|---|---|
| comparison example 1 | 1:1:1 (3.3/3.3/3.3 μm) | 1997.4 | — |
| comparison example 2 | 1.5:1:1 (4.95/3.3/3.3 μm) | 1895.9 (−5.08%) | +0.6% |
| comparison example 3 | 1:1.5:1 | 1910.3 (−4.36%) | +0.8% |
| comparison example 4 | 1:1:1.5 | 1804.9 (−9.65%) | +1.0% |
| comparison example 5 | 1:0.7:1 | 2059.0 (+3.11%) | −0.5% |
| comparison example 6 | 1:1:0.7 | 2135.1 (+6.91%) | −0.6% |
| comparison example 7 | 1.5:1:0.5 | 2088.5 (+4.56%) | +0.6% |
| comparison example 8 | 1:1.5:0.5 | 2102.9 (+5.28%) | −0.2% |
| comparison example 9 | 1:1.2:0.7 | 2102.4 (+5.21%) | −0.1% |
| aspect 1 | 1:0.5:1.3 | 1949.7 (−2.38%) | −0.1% |
| aspect 2 | 1:0.5:1.5 | 1891.9 (−5.28%) | +0.2% |
| aspect 3 | 1:0.7:1.2 | 1984.6 (−0.64%) | −0.3% |

When one of the first to third color filters is formed to be thicker than the thicknesses of the other color filter layers, the thickness of the overcoat layer is relatively thin, so that light transmittance is enhanced, thus reducing power consumption. However, when the light transmittance is enhanced, the reflectance due to the lower metal layer is also relatively increased, so that the screen visibility is reduced, rendering it difficult to use it as a display.

When the thickness of the blue color filter layer is formed to be smaller than the thicknesses of other color filter layers, the light loss due to the overcoat layer is increased in terms of light transmittance due to the characteristics of the blue color having a short wavelength, thereby increasing power consumption. Therefore, the thickness of the blue color filter layer should be larger than the thicknesses of the other color filter layers.

However, thickening the blue color filter layer enhances light transmittance, relatively increasing the reflectance due to the lower metal layer. To compensate for this, the green color filter layer having a low loss in light transmittance may be formed to have a reduced thickness.

From aspect 1, aspect 2, and aspect 3 of the present disclosure, it may be identified that when, among the color filter layers, the blue color filter layer is thickest, and the green color filter layer is thinnest, power consumption is reduced, and an equivalent performance or higher reflectance is achieved, so that the display panel may have an increased lifespan.

An overcoat layer 260 may be disposed on the first to third color filters 251, 252, and 253. The overcoat layer 260 may be disposed on an entire surface of the active area A/A of the organic light emitting display device 100, but the present disclosure is not limited thereto. The overcoat layer 260 may also be disposed on the whole or part of the non-active area N/A.

The overcoat layer 260 may include a plurality of colored particles 265. The plurality of colored particles 265 may include at least one type of particles among the first particles, second particles, and third particles, but may include other colors of particles.

For example, the overcoat layer 260 may include the first particles included in the first color filter 251. In this case, the amount of the first particles included in the overcoat layer 260 may be less than the amount of the first particles included in the first color filter 251.

The overcoat layer 260 may include the second particles included in the second color filter 252. In this case, the amount of the second particles included in the overcoat layer 260 may be less than the amount of the second particles included in the second color filter 252.

The overcoat layer 260 may include the third particles included in the third color filter 253. In this case, the amount of the third particles included in the overcoat layer 260 may be less than the amount of the third particles included in the third color filter 253.

The plurality of colored particles 265 included in the overcoat layer 260 according to aspects of the present disclosure may include at least two types of particles among the first to third particles included in the first to third color filters 251, 252, and 253, respectively.

For example, the plurality of colored particles 265 included in the overcoat layer 260 may include a plurality of first and second particles, a plurality of second and third particles, a plurality of first and third particles, or a plurality of first to third particles. The amount of the plurality of colored particles 265 included in the overcoat layer 260 may be less than the amount of the first particles included in the first color filter 251, be less than the amount of the second particles included in the second color filter 252, and be less than the amount of the third particles included in the third color filter 253.

The plurality of colored particles 265 included in the overcoat layer 260 according to aspects of the present disclosure may include other particles than the first to third particles included in the first to third color filters 251, 252, and 253, respectively. The types of the plurality of colored particles 265 may be two or more, and each type of particles may have a different color.

As such, as the plurality of colored particles 265 are included in the overcoat layer 260, light (external light) incident from the outside of the organic light emitting display device 100 may be absorbed, thereby reducing external light reflectance. In particular, the organic light emitting display device 100 according to aspects of the present disclosure may include a color filter layer 250 and a bank 320 in an opaque color disposed on the encapsulation layer 230. As the overcoat layer 260 including a plurality of colored particles 265 is included, the external light reflectance may be effectively reduced.

Further, since the amount of the plurality of colored particles 265 included in the overcoat layer 260 is less than the amount of the first to third particles included in each of the first to third color filters 251, 252 and 253, it is possible to suppress transmitting only a specific wavelength band of light while absorbing light of the remaining wavelength bands, thereby allowing most of the light from the organic light emitting element 210 to be emitted to the outside.

When the plurality of colored particles 265 included in the overcoat layer 260 include at least two types of particles, the overcoat layer 260 may implement a gray color.

The color of the overcoat layer 260 may be black or may be different from the color of the opaque bank 320.

An adhesive layer 270 and a cover window 280 may be disposed on the overcoat layer 260.

The color of the overcoat layer 260 according to aspects of the present disclosure may be different from the color of the adhesive layer 270.

For example, the adhesive layer 270 may be a transparent adhesive layer 270. In this case, the adhesive layer 270 may be formed of an optically clear adhesive (OCA) layer or an optically clear resin (OCR) layer, but the present disclosure is not limited thereto.

The adhesive layer 270 may be a black adhesive layer 270. When the adhesive layer 270 is black, the adhesive layer 270 may have a state in which black insulative particles are dispersed in an optically clear adhesive (OCA) or an optically clear resin (OCR), but the present disclosure is not limited thereto.

The black adhesive layer 270 may serve to reduce the reflectance of external light of the organic light emitting display device 100 free from a polarizing plate.

However, when the black adhesive layer 270 is applied to prevent the luminance from dropping during operation of the organic light emitting display device 100, the color saturation (or chroma) of the overcoat layer 260 may be low as compared with when the adhesive layer 270 is transparent. In other words, in the organic light emitting display device 100 according to aspects of the present disclosure, the color saturation of the overcoat layer 260 may be adjusted according to the color of the adhesive layer 270.

As shown in FIG. 4, the overcoat layer 260 may include a plurality of colored particles 265 in uniform quantities in an area corresponding to the plurality of subpixels SP1, SP2, and SP3, but the present disclosure is not limited thereto.

The flatness of the overcoat layer 260 of the present disclosure may be 90% or more. The flatness may be calculated by subtracting the step difference of the overcoat layer from the thickness difference compared to the thickness difference between the adjacent color filter layers under the overcoat layer. The flatness close to 100 means that there is no or little step so that overcoat layer is flat.

When the flatness of the overcoat layer 260 is less than 90%, the overcoat layer may not be coated on two opposite ends of the color filter layer, so that a defect may occur in the process, and the uniformity of the overcoat layer thickness is reduced, so that the possibility of occurrence of luminance non-uniformity for each area during panel driving increases. Further, failure to meet a predetermined level or more in the flatness of the overcoat layer may diffuse light and thus reflection at the interface, leading to an increase in the reflectance of the entire panel.

To meet the flatness of the overcoat layer above a certain level, the intermolecular attraction is reduced by reducing polarity and containing 5% or more of a solvent a boiling point of 130° C. or higher to thereby control the flowability of the overcoat layer during soft baking. Thus, it is possible to increase the flatness to 90% or higher.

The overcoat layer may be formed of a binder, a polymer, colored particles, a photoinitiator, an additive, a solvent, and the like. The overcoat layer may further include an adhesion promoter or surfactant. More specifically, the overcoat layer may include binder 2-20 wt %, polymer 10-30 wt %, colored particles 0.3-3.5 wt %, photoinitiator 0.1-5 wt %, additive 1-10 wt %, adhesion promoter 0.1-3 wt %, surfactant 0.1-3 wt % and the remainder which is the solvent. The colored particles may be black or gray, but are not limited thereto.

The content of the colored particles 265 included in the overcoat layer 260 may be 0.3 to 3.5 wt %. If the content of the colored particles 265 of the overcoat layer is less than 0.3 wt %, it may be impossible to reduce the reflectance to a level enough to secure good outdoor visibility. Further, if the content of the colored particles 265 exceeds 3.5 wt %, the light transmittance is not sufficient, so that the luminance decreases and power consumption increases. The content of the colored particles 265 in the overcoat layer 260 may be 1 wt % or more and 3 wt % or less.

It has been described that the plurality of colored particles 265 included in the overcoat layer 260 may be particles included in at least one of the first to third color filters 251, 252, and 253, but the present disclosure is not limited thereto.

For example, the plurality of colored particles 265 included in the overcoat layer 260 may include carbon black-based black pigment, such as carbon black, and/or organic-based pigment, such as lactam black, aniline black, perylene black, and acetylene black, or a non-metallic pigment, and the amount of the above-mentioned particles may be adjusted so that the overcoat layer 660 may have a color other than black. If the overcoat layer 260 includes other particles in addition to black particles, the other particles may include a red pigment or dye, a blue pigment or dye, or a purple pigment or dye.

Although not shown in the drawings, a second overcoat layer may be additionally provided on the overcoat layer 260.

The surface of the overcoat layer 260 may not be flat. In this structure, when the cover window 280 is attached by the adhesive layer 270, a predetermined degree of stress may be applied to the cover window 280. The stress may concentrate on the cover window 280 in the area corresponding to the step of the overcoat layer 260, damaging the cover window 280. Even when the cover window 280 is not damaged, the display panel may not be formed flat.

In the organic light emitting display device 100 provided with an additional overcoat layer, the second overcoat layer formed on the overcoat layer 260 may compensate for the step formed in the overcoat layer 260 and, resultantly, the surface of the second overcoat layer may be flattened. By being formed of a transparent material, the second overcoat layer may flatten the upper surface of the substrate 201 where the adhesive layer 270 is formed without reducing the transmittance of the organic light emitting display device 100.

Although a structure in which the organic light emitting display device 100 according to aspects of the present disclosure includes the first to third subpixels SP1, SP2, and SP3 representing different colors has been described above in connection with FIGS. 2 to 4, the present disclosure is not limited thereto.

Figure 5A:
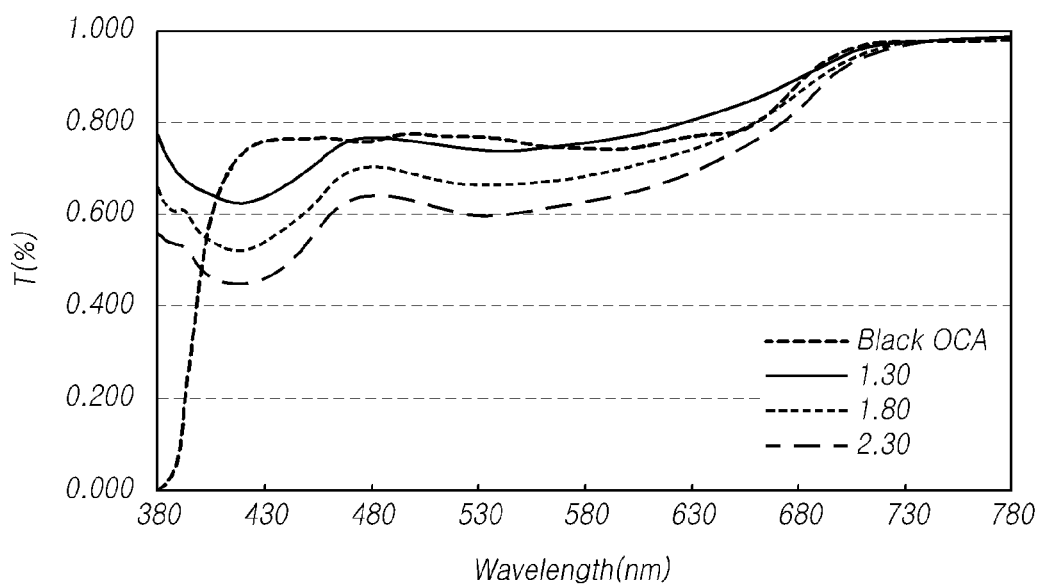
FIGS. 5A, 5B, and 5C are graphs illustrating the transmittance per wavelength of an overcoat layer applied to an organic light emitting display device according to aspects of the present disclosure.
Figure 5B:
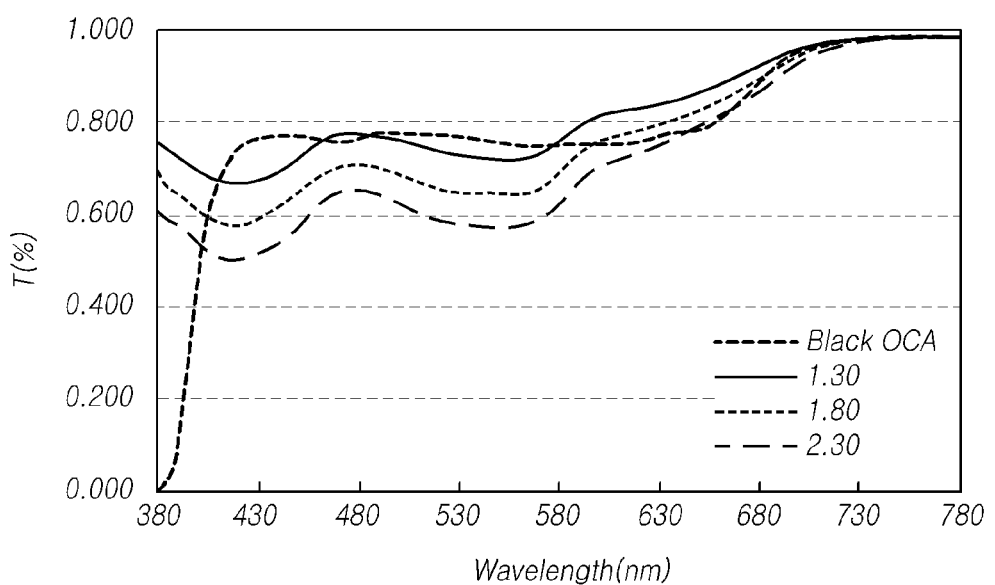
Figure 5C:
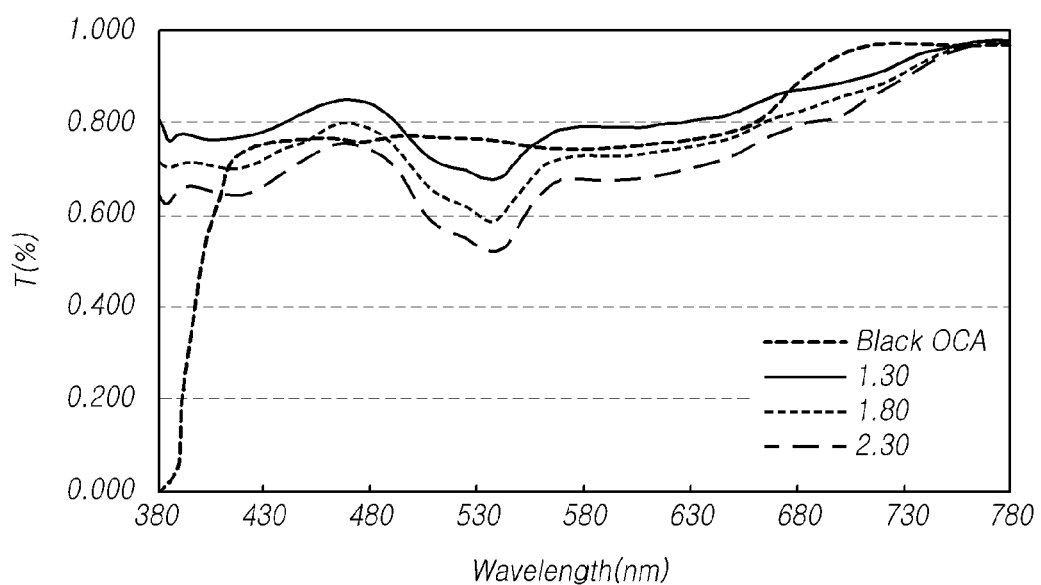

FIGS. 5A, 5B, and 5C are graphs illustrating the transmittance per wavelength of an overcoat layer applied to an organic light emitting display device according to aspects of the present disclosure. Comparison in the transmittance according to the wavelength of the overcoat layer and the black adhesive layer applied to the organic light emitting display device according to an aspect of the present disclosure is described below.

FIG. 5A is a graph of the transmittance depending on the wavelength when the overcoat layer 260 includes one type of black colored particles 265 in an organic light emitting display device according to aspects of the present disclosure.

FIG. 5B is a graph of the transmittance depending on the wavelength when the overcoat layer 260 includes two types of colored particles, e.g., black and red, in an organic light emitting display device according to aspects of the present disclosure.

FIG. 5C is a graph of the transmittance depending on the wavelength when the overcoat layer 260 includes three types of colored particles, e.g., black, blue, and purple, in an organic light emitting display device according to aspects of the present disclosure.

According to FIGS. 5A to 5C, the spectrum of the overcoat layer 260 in the organic light emitting display device according to the aspect of the present disclosure has a transmittance increased by 3 to 20% or more in the 430 nm wavelength band (blue) and reduced by 5% or more in the 550 nm wavelength band (green) as compared with the adhesive layer in black.

When the spectrum of the overcoat layer 260 exhibits the above-described aspect, the entire display panel may has an equivalent or larger reflectance and has an increased transmittance, thereby reducing power consumption.

FIGS. 5A, 5B, and 5C are graphs illustrating the transmittance per wavelength of an overcoat layer applied to an organic light emitting display device according to aspects of the present disclosure. Comparison in the transmittance according to the wavelength of the overcoat layer and the black adhesive layer applied to the organic light emitting display device according to an aspect of the present disclosure is described below.

FIG. 5A is a graph of the transmittance depending on the wavelength when the overcoat layer 260 includes one type of black colored particles 265 in an organic light emitting display device according to aspects of the present disclosure.

FIG. 5B is a graph of the transmittance depending on the wavelength when the overcoat layer 260 includes two types of colored particles, e.g., black and red, in an organic light emitting display device according to aspects of the present disclosure.

FIG. 5C is a graph of the transmittance depending on the wavelength when the overcoat layer 260 includes three types of colored particles, e.g., black, blue, and purple, in an organic light emitting display device according to aspects of the present disclosure.

According to FIGS. 5A to 5C, the spectrum of the overcoat layer 260 in the organic light emitting display device according to the aspect of the present disclosure has a transmittance increased by 3 to 20% or more in the 430 nm wavelength band (blue) and reduced by 5% or more in the 550 nm wavelength band (green) as compared with the adhesive layer in black.

When the spectrum of the overcoat layer 260 exhibits the above-described aspect, the entire display panel may has an equivalent or larger reflectance and has an increased transmittance, thereby reducing power consumption.

Figure 6:
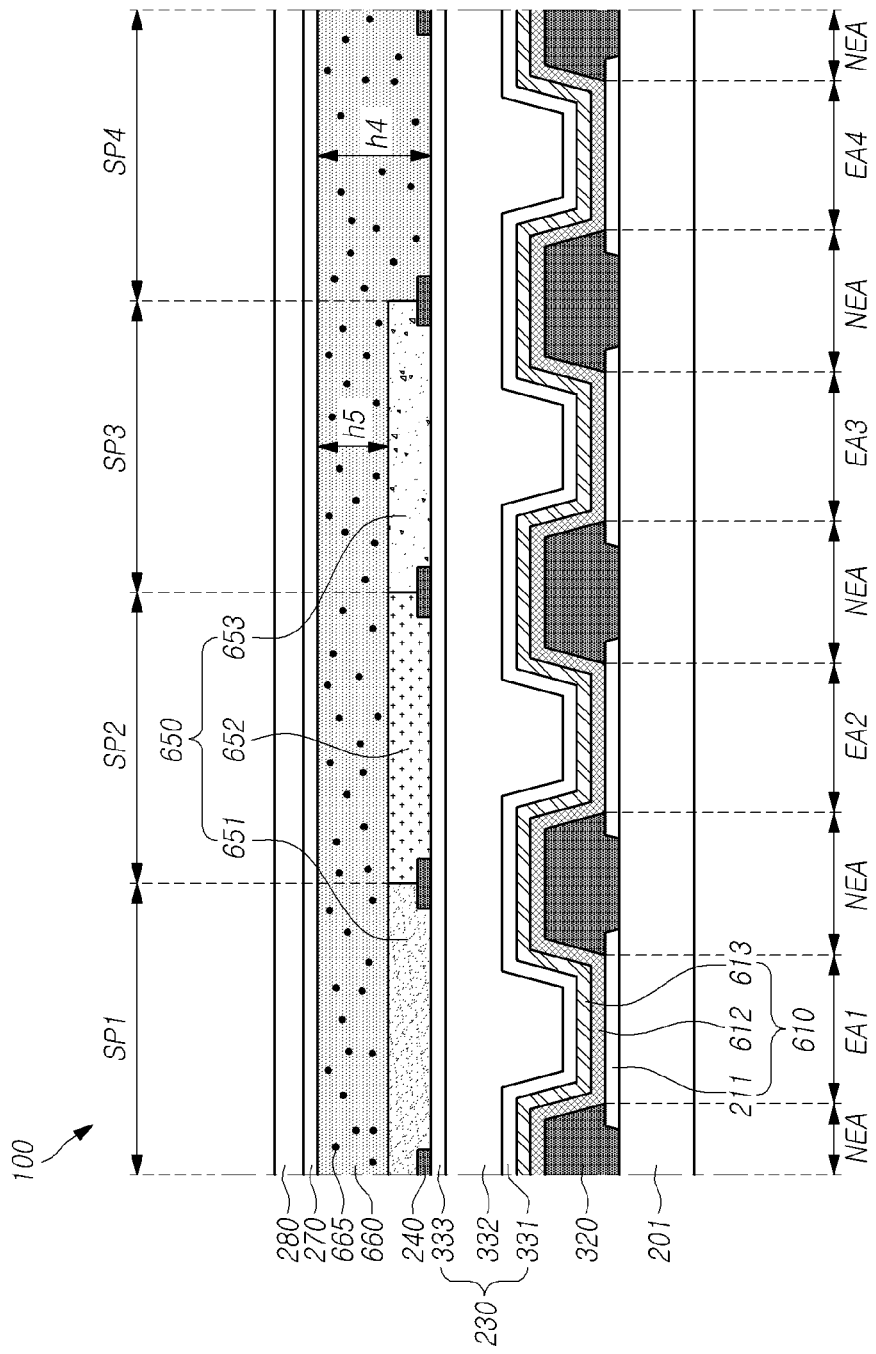
FIG. 6 is a cross-sectional view schematically illustrating a first subpixel, a second subpixel, a third subpixel, and a fourth subpixel disposed in an active area of an organic light emitting display device according to aspects of the present disclosure.
Figure 7:
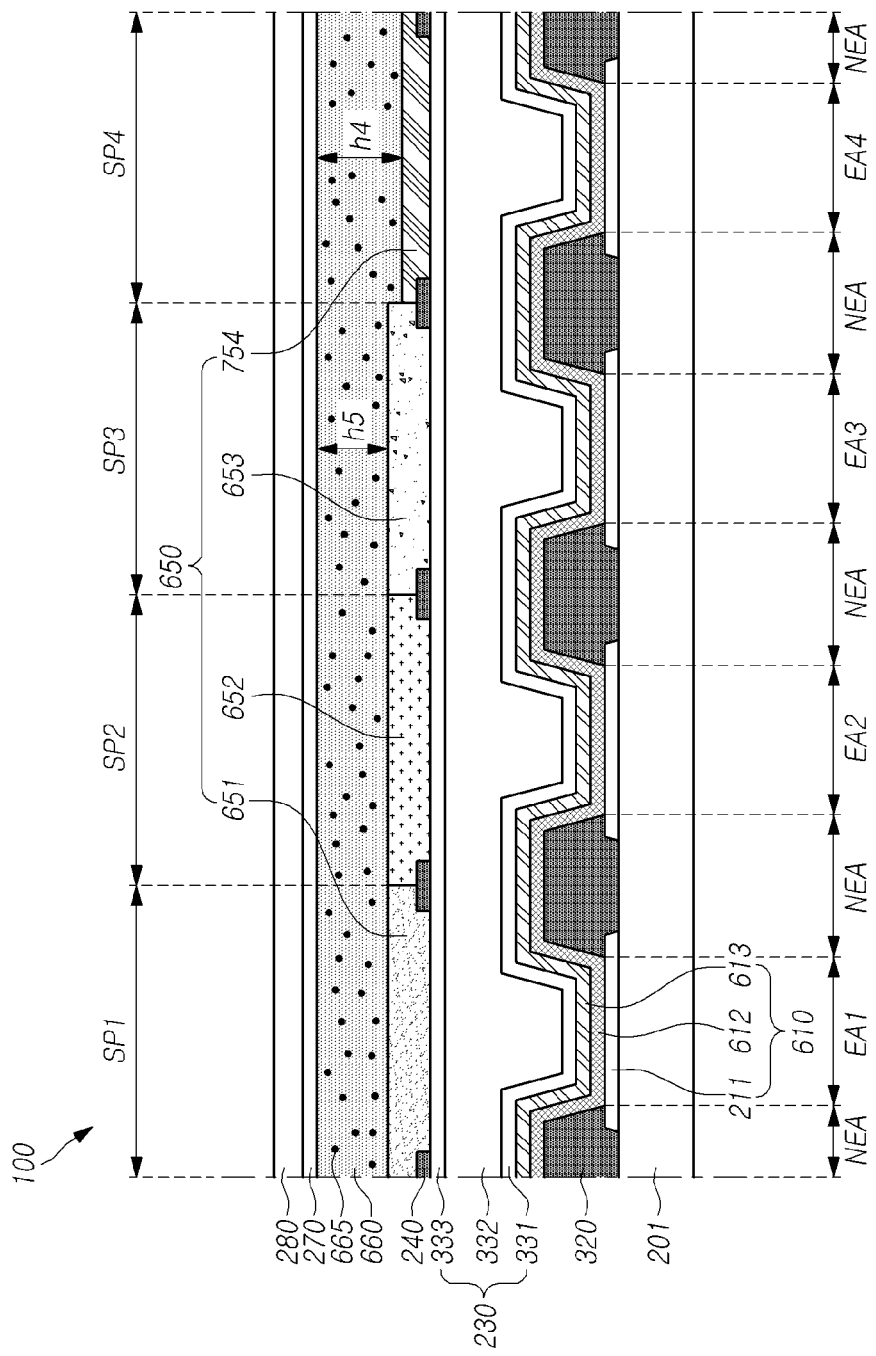
FIG. 7 is a cross-sectional view schematically illustrating a first subpixel, a second subpixel, a third subpixel, and a fourth subpixel disposed in an active area of an organic light emitting display device according to other aspects of the present disclosure.

FIG. 6 is a cross-sectional view schematically illustrating a first subpixel, a second subpixel, a third subpixel, and a fourth subpixel disposed in an active area of an organic light emitting display device according to aspects of the present disclosure. FIG. 7 is a cross-sectional view schematically illustrating a first subpixel, a second subpixel, a third subpixel, and a fourth subpixel disposed in an active area of an organic light emitting display device according to other aspects of the present disclosure.

Substantially the same configurations and effects as those described above are not repeatedly described below.

Referring to FIGS. 6 and 7, the organic light emitting display device 100 according to aspects of the present disclosure may include a first subpixel SP1, a second subpixel SP2, a third subpixel SP3, and a fourth subpixel SP4. The first subpixel SP1 may include a first emission area EA1, the second subpixel SP2 may include a second emission area EA2, the third subpixel SP3 may include a third emission area EA3, and the fourth subpixel SP4 may include a fourth emission area EA4.

In this case, as illustrated in FIGS. 6 and 7, the light emitting layer 612 of the organic light emitting element 610 may be disposed to overlap the first electrode 211 and the bank 320. For example, the light emitting layer 612 of the organic light emitting element 610 may be disposed on the entire surface of the substrate 201 in the active area, but the structure of the light emitting layer 612 according to the aspect of the present disclosure is not limited thereto. As illustrated in FIGS. 3 and 4, the light emitting layer 212 of the organic light emitting element 210 may be disposed only on the upper surface of the first electrode 211 exposed by the bank 320.

In this case, the first emission area EA1 may be an emission area emitting red (R) light, the second emission area EA2 may be an emission area emitting green (G) light, the third emission area EA3 may be an area emitting blue (B) light, and the fourth emission area EA4 may be an area emitting white (W) light, but the present disclosure is not limited thereto.

A first color filter 651 may be disposed on the encapsulation layer 230 in the area overlapping the first emission area EA1, a second color filter 652 may be disposed on the encapsulation layer 230 in the area overlapping the second emission area EA2, and a third color filter 653 may be disposed on the encapsulation layer 230 in the area overlapping the third emission area EA3. As illustrated in FIG. 6, a color filter may not be disposed on the encapsulation layer 230 in an area overlapping the fourth emission area EA4.

However, the structure of the organic light emitting display device 100 according to aspects of the present disclosure is not limited thereto and, to adjust the color coordinates of the organic light emitting display device 100 or to reduce the external light reflectance for the fourth subpixel SP4, a fourth color filter 754 may be disposed on the encapsulation layer 230 in the area overlapping the fourth emission area EA4 as shown in FIG. 7.

The thickness of the fourth color filter 754 may be smaller than the thicknesses of the first to third color filters 651, 652, and 653, but the present disclosure is not limited thereto.

The fourth color filter 754 may have the same color as any one of the first to third color filters 651, 652, and 653 or may have a color (e.g., sky blue) different from the first to third color filters 651, 652 and 653.

As shown in FIGS. 6 and 7, the thickness of the overcoat layer 660 disposed in the fourth subpixel SP4 may be larger than the thickness of the overcoat layer 660 disposed in the remaining subpixels SP1, SP2, and SP3.

For example, the thickness of the overcoat layer 660 disposed in the fourth subpixel SP4 may be h4, and the thickness of the overcoat layer 660 disposed in the remaining subpixels SP1, SP2, and SP3 may be h5. The thickness h4 of the overcoat layer 660 disposed in the fourth subpixel SP4 may be larger than the thickness h5 of the overcoat layer 660 disposed in the remaining subpixels SP1, SP2, and SP3.

Specifically, the thickness h4 of the overcoat layer 660 disposed in the fourth subpixel SP4 and the thickness h5 of the overcoat layer 660 disposed in the remaining subpixels SP1, SP2, and SP3 may meet the following equation.

$$1.5 \leq \frac{h4}{h5} \leq 6.0 \quad \text{(Equation 3)}$$

Here, the thickness h4 of the overcoat layer 660 disposed in the fourth subpixel SP4 may be at least 1.5 µm, and may be 6 µm or less. If the thickness h4 of the overcoat layer 660 disposed in the fourth subpixel SP4 is smaller than 1.5 µm, transmittance is enhanced but reflectance is increased and, if larger than 6 µm, processability upon manufacture may be deteriorated due to the large thickness. The thickness h5 of the overcoat layer 660 disposed in the remaining subpixels SP1, SP2, and SP3 may be at least 1 µm and may be 4 µm or less. If the thickness h5 of the overcoat layer 660 disposed in the remaining subpixels SP1, SP2, and SP3 is smaller than 1 µm, transmittance is enhanced but reflectance is increased and, if larger than 4 µm, the reflectance may be reduced, but the transmittance may be reduced.

TABLE 2

| | | Comparison example 10 | Aspect 4 (2/1 µm) | Aspect 5 (3/1 µm) | Aspect 6 (4/1 µm) |
|---|---|---|---|---|---|
| Thickness ratio of overcoat layer (h4/h5) | | — | 2 | 3 | 4 |
| color coordinates | Rx | 0.681 | 0.681 | 0.681 | 0.681 |
| | Ry | 0.320 | 0.320 | 0.320 | 0.320 |
| | Gx | 0.255 | 0.253 | 0.253 | 0.253 |
| | Gy | 0.681 | 0.681 | 0.681 | 0.681 |
| | Bx | 0.145 | 0.145 | 0.145 | 0.145 |
| | By | 0.051 | 0.051 | 0.051 | 0.051 |
| | Wx | 0.295 | 0.291 | 0.289 | 0.287 |
| | Wy | 0.326 | 0.317 | 0.312 | 0.308 |
| FW pure color luminance (nit) | R | 203 | 198 | 198 | 198 |
| | G | 287 | 276 | 276 | 276 |
| | B | 244 | 243 | 243 | 243 |
| | W | 189 | 195 | 199 | 203 |

From aspect 4, aspect 5, and aspect 6 of the present disclosure, it may be identified that the thickness h4 of the overcoat layer 660 disposed in the fourth subpixel SP4 and the thickness h5 of the overcoat layer 660 disposed in the remaining subpixels SP1, SP2, and SP3 may have equivalent levels of color coordinate values and have enhanced FW pure color luminance when meeting equation 3 above.

The thickness h4 of the overcoat layer 660 disposed in the fourth subpixel SP4 may be adjusted by the Half Tone Mask (H/T Mask) process.

Accordingly, in the overcoat layer 660, no color filter is disposed in the fourth subpixel SP4, or the fourth color filter 754 thinner than those of the first to third color filters 651, 652, and 653 is disposed in the fourth subpixel SP4, compensating for the generated step.

Accordingly, the overcoat layer 660 may reduce the external light reflectance of the organic light emitting display device 100 that does not include a polarizing plate while compensating for the step generated by the plurality of color filters 650.

Accordingly, the adhesive layer 270 and the cover window 280 may be disposed on the overcoat layer 660 having a flat surface.

Further, as described above, the overcoat layer 660 according to aspects of the present disclosure may include a plurality of colored particles 665 to decrease the reflectance of external light.

The plurality of colored particles 665 may include at least one type of particles among the first particles, second particles, and third particles, but may include other colors of particles.

For example, the overcoat layer 660 may include the first particles included in the first color filter 651. The overcoat layer 660 may include the second particles included in the second color filter 652. The overcoat layer 660 may include the third particles included in the third color filter 653.

The plurality of colored particles 665 included in the overcoat layer 660 according to aspects of the present disclosure may include at least two types of particles among the first to third particles included in the first to third color filters 651, 652, and 653, respectively.

For example, the plurality of colored particles 665 included in the overcoat layer 660 may include a plurality of first and second particles, a plurality of second and third particles, a plurality of first and third particles, or a plurality of first to third particles. The amount of the plurality of colored particles 665 included in the overcoat layer 660 may be less than the amount of the first particles included in the first color filter 651, be less than the amount of the second particles included in the second color filter 652, and be less than the amount of the third particles included in the third color filter 653.

The plurality of colored particles 665 included in the overcoat layer 660 according to aspects of the present disclosure may include other particles than the first to third particles included in the first to third color filters 651, 652, and 653, respectively. The types of the plurality of colored particles 665 may be two or more, and each type of particles may have a different color.

As such, as the plurality of colored particles 665 are included in the overcoat layer 660, light (external light) incident from the outside of the organic light emitting display device 100 may be absorbed, thereby reducing external light reflectance. In particular, the organic light emitting display device 100 according to aspects of the present disclosure may include a color filter layer 650 and a bank 320 in an opaque color disposed on the encapsulation layer 230. As the overcoat layer 660 including a plurality of colored particles 665 is included, the external light reflectance may be effectively reduced.

Further, since the amount of the plurality of colored particles 665 included in the overcoat layer 660 is less than the amount of the first to third particles included in each of the first to third color filters 651, 652 and 653, it is possible to suppress transmitting only a specific wavelength band of light while absorbing light of the remaining wavelength bands, thereby allowing most of the light from the organic light emitting element 610 to be emitted to the outside.

When the plurality of colored particles 665 included in the overcoat layer 660 include at least two types of particles, the overcoat layer 660 may implement a gray color.

The color of the overcoat layer 660 may be black or may be different from the color of the opaque bank 320.

The flatness of the overcoat layer 660 of the present disclosure may be 90% or more. The flatness may be calculated by subtracting the step difference of the overcoat layer from the thickness difference compared to the thickness difference between the adjacent color filter layers under the overcoat layer. The flatness close to 100 means that there is no or little step so that overcoat layer is flat.

When the flatness of the overcoat layer 660 is less than 90%, the overcoat layer may not be coated on two opposite ends of the color filter layer, so that a defect may occur in the process, and the uniformity of the overcoat layer thickness is reduced, so that the possibility of occurrence of luminance non-uniformity for each area during panel driving increases. Further, failure to meet a predetermined level or more in the flatness of the overcoat layer may diffuse light and thus reflection at the interface, leading to an increase in the reflectance of the entire panel.

The overcoat layer 660 may be formed of a binder, a polymer, colored particles, a photoinitiator, an additive, a solvent, and the like. The overcoat layer may further include an adhesion promoter or surfactant. More specifically, the overcoat layer may include binder 2-20 wt %, polymer 10-30 wt %, colored particles 0.1-10 wt %, photoinitiator 0.1-5 wt %, additive 1-10 wt %, adhesion promoter 0.1-3 wt %, surfactant 0.1-3 wt % and the remainder which is the solvent. The colored particles may be black or gray, but are not limited thereto.

The content of the colored particles 665 included in the overcoat layer 660 may be 0.1 to 10 wt %. If the content of the colored particles 665 of the overcoat layer is less than 0.1 wt %, it may be impossible to reduce the reflectance to a level enough to secure good outdoor visibility. Further, if the content of the colored particles 665 exceeds 10 wt %, the reflective index increases, and the light transmittance is not sufficient, so that the luminance decreases and power consumption increases. The content of the colored particles 665 in the overcoat layer 660 may be 1 wt % or more and 8 wt % or less.

It has been described that the plurality of colored particles 665 included in the overcoat layer 660 may be particles included in at least one of the first to third color filters 651, 652, and 653, but the present disclosure is not limited thereto.

For example, the plurality of colored particles 665 included in the overcoat layer 660 may include carbon black-based black pigment, such as carbon black, and/or organic-based pigment, such as lactam black, aniline black, perylene black, and acetylene black, or a non-metallic pigment, and the amount of the above-mentioned particles may be adjusted so that the overcoat layer 660 may have a color other than black. If the overcoat layer 660 includes other particles in addition to black particles, the other particles may include a red pigment or dye, a blue pigment or dye, or a purple pigment or dye.

An adhesive layer 270 and a cover window 280 may be disposed on the overcoat layer 660.

To reduce external light reflectance, the adhesive layer 270 may be formed in black.

The overcoat layer 660 and the adhesive layer 270 may decrease the reflectance of light incident from the outside of the organic light emitting display device 100 while increasing the transmittance of light emitted from the organic light emitting element.

Figure 8:
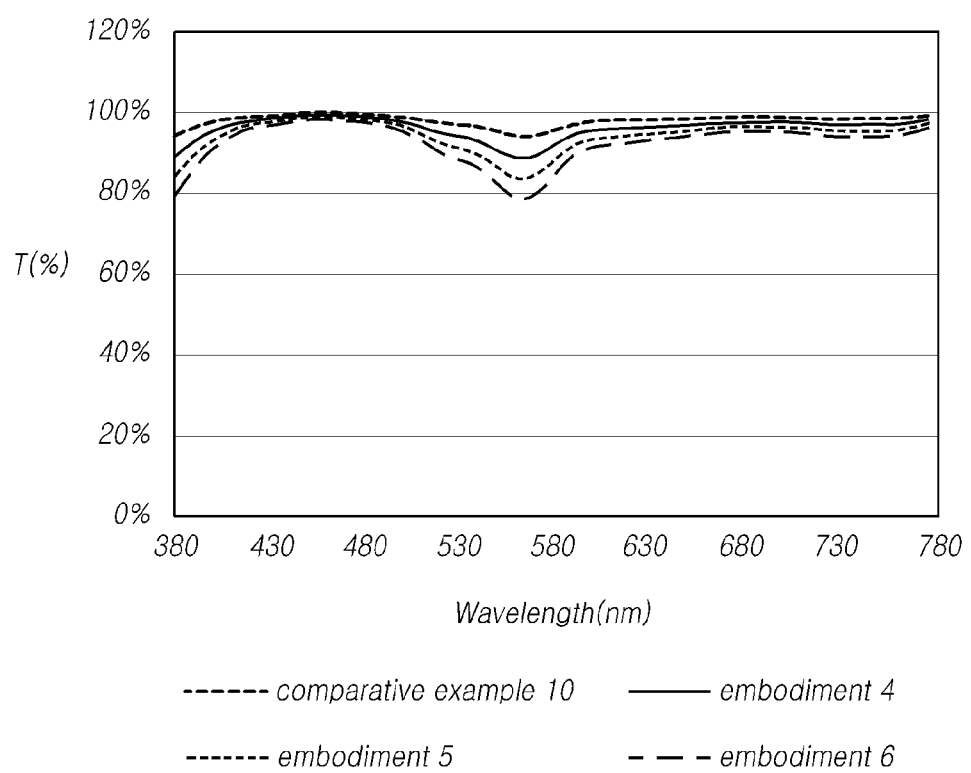
FIG. 8 is a graph illustrating the transmittance per wavelength depending on the thickness of an overcoat layer applied to an organic light emitting display device according to aspects of the present disclosure.

FIG. 8 is a graph illustrating the transmittance per wavelength depending on the thickness of an overcoat layer applied to an organic light emitting display device according to aspects of the present disclosure. Specifically, FIG. 8 is a graph of the transmittance depending on the wavelength for aspects 4 to 6 for a combination of the thickness h4 of the overcoat layer 660 disposed in the fourth subpixel SP4 and the thickness h5 of the overcoat layer 660 disposed in the remaining subpixels SP1, SP2, and SP3.

Figure 9:
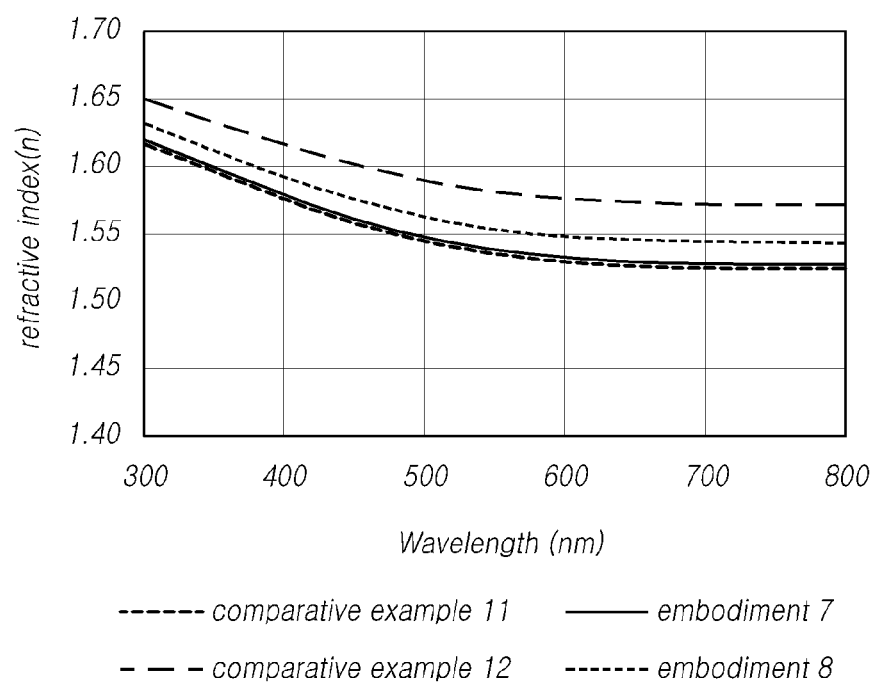
FIG. 9 is a graph illustrating the refractive index per wavelength of an overcoat layer depending on the content of colored particles applied to an organic light emitting display device according to aspects of the present disclosure.

FIG. 9 is a graph illustrating the transmittance per wavelength of an overcoat layer 660 depending on the content of colored particles 665 applied to an organic light emitting display device according to aspects of the present disclosure. Specifically, comparative example 11 is a transparent overcoat layer that does not contain colored particles, and aspects 7 and 8 and comparative example 12 are graphs for the refractive index per wavelength of the overcoat layer when respectively containing 2.3 wt %, 6.8 wt % and 11.0 wt % of colored particles. In this case, aspects 7 and 8 and comparative example 12 showed the transmittances of 76.1%, 44.4%, and 27.3%, respectively.

Figure 10:
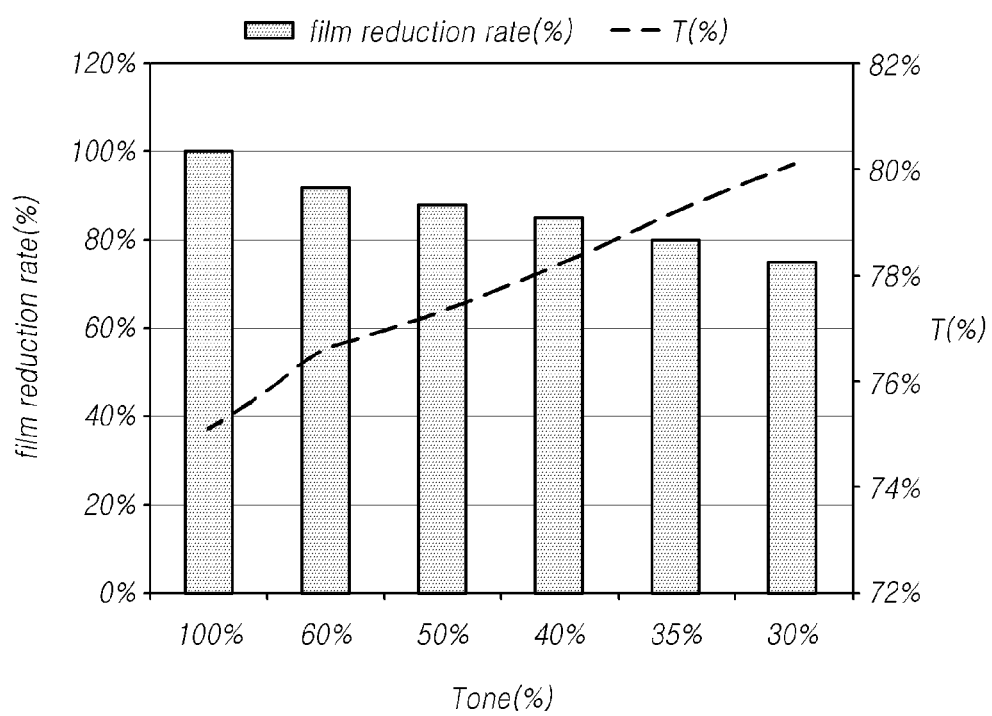
FIG. 10 is a graph illustrating the transmittance and film reduction rate of an overcoat layer depending on the Half Tone Mask (H/T Mask) ratio applied to an organic light emitting display device according to aspects of the present disclosure.

FIG. 10 is a graph illustrating the transmittance and film reduction rate of an overcoat layer depending on the Half Tone Mask (H/T Mask) ratio applied to an organic light emitting display device according to aspects of the present disclosure. Specifically, when the transmittance of the Half Tone Mask (H/T Mask) is 30%, it may be seen that the film reduction rate, which is the rate at which the thickness of the overcoat layer decreases, is 25%, and the transmittance is enhanced by about 5%.

Referring to FIGS. 8 to 10, in the organic light emitting display device according to aspects of the present disclosure, the overcoat layer 660 disposed in the fourth subpixel SP4 exhibits a high transmittance of 40% to 90%.

When the spectrum of the overcoat layer 660 exhibits the above-described aspect, the entire display panel may has an equivalent or larger reflectance and has an increased transmittance, thereby reducing power consumption.

While the present disclosure has been shown and described in connection with example aspects thereof, the present disclosure is not limited to the technical spirit disclosed in the aspects. Rather, it will be appreciated by one of ordinary skill in the art that various changes or modifications thereto may be made without departing from the scope of the present disclosure and belong to the scope of the present disclosure, which is defined by the claims appended below.

What is claimed is:

1. An organic light emitting display device, comprising:
    a first subpixel, a second subpixel, and a third subpixel disposed in an active area on a substrate;
    an organic light emitting element disposed on the substrate;
    an encapsulation layer disposed on the organic light emitting element;
    a color filter layer disposed on the encapsulation layer;
    an overcoat layer in an opaque color, disposed on the color filter layer and including colored particles; and
    an adhesive layer disposed on the overcoat layer,
    wherein the overcoat layer differs in color from the color filter layer and the adhesive layer, and
    wherein the color filter layer includes a first color filter disposed in the first subpixel, a second color filter disposed in the second subpixel, and a third color filter disposed in the third subpixel, and a boundary area between different color filters includes at least one step, wherein the at least one step is configured to have different levels of top surfaces of the first, second and third color filters.

2. The organic light emitting display device of claim 1, wherein the first color filter includes first particles, the second color filter includes second particles different from the first particles, and the third color filter includes third particles different from the first particles and the second particles.

3. The organic light emitting display device of claim 2, wherein the colored particles include at least one type of particles among the first to third particles.

4. The organic light emitting display device of claim 1, wherein the second color filter includes at least one of a green pigment or a green dye, and
    wherein a thickness of the second color filter is equal to or smaller than a thickness of the first color filter and a thickness of the third color filter.

5. The organic light emitting display device of claim 4, wherein the first color filter includes at least one of a red pigment or a red dye, and the third color filter includes at least one of a blue pigment and a blue dye.

6. The organic light emitting display device of claim 5, wherein the thickness of the third color filter is equal to or larger than a thickness of the first color filter.

7. The organic light emitting display device of claim 5, wherein a thickness of the first color filter is h1, a thickness of the second color filter is h2, and a thickness of the third color filter is h3 satisfy Equations 1 and 2, $$0.5 \le \frac{h2}{h1} \le 1.0 \quad \text{(Equation 1)}$$

$$1.0 \le \frac{h3}{h1} \le 1.5. \quad \text{(Equation 2)}$$

8. The organic light emitting display device of claim 1, wherein a transmittance of the overcoat layer at a wavelength of 430 nm is 60% or more and 90% or less.

9. The organic light emitting display device of claim 1, wherein the colored particles included in the overcoat layer include one or more of non-metallic pigments including carbon black, lactam black, aniline black, perylene black, and acetylene black, and wherein a content of the colored particles is 0.3 wt % or more.

10. The organic light emitting display device of claim 1, wherein the overcoat layer has a flatness of 90% or more.

11. The organic light emitting display device of claim 1, wherein the adhesive layer has a transparent color and the overcoat layer has a gray color.

12. The organic light emitting display device of claim 1, wherein the adhesive layer has a black color, and the overcoat layer has a color other than black.

13. The organic light emitting display device of claim 1, wherein a fourth subpixel is further disposed in the active area, and
    wherein a thickness of the overcoat layer in an area corresponding to the fourth subpixel is larger than a thickness of the overcoat layer in an area corresponding to the first to third subpixels.

14. The organic light emitting display device of claim 13, wherein no color filter is disposed in the fourth subpixel, or a thickness of a color filter disposed in the fourth subpixel is smaller than thicknesses of the first to third color filters.

15. The organic light emitting display device of claim 13, wherein a thickness of the overcoat layer in the area corresponding to the fourth subpixel is h4, and a thickness of the overcoat layer in the area corresponding to the first to third subpixels is h5 satisfy Equation 3, $$1.5 \le \frac{h4}{h5} \le 6.0. \quad \text{(Equation 3)}$$

16. The organic light emitting display device of claim 13, wherein a transmittance of the overcoat layer in the area corresponding to the fourth subpixel is 40% or more and 90% or less.

17. The organic light emitting display device of claim 13, wherein the colored particles included in the overcoat layer include one or more of non-metallic pigments including carbon black, lactam black, aniline black, perylene black, and acetylene black, and wherein a content of the colored particles is 0.1 wt % or more.

18. The organic light emitting display device of claim 13, wherein the overcoat layer has a flatness of 90% or more.

19. The organic light emitting display device of claim 13, wherein the first color filter includes first particles, the second color filter includes second particles different from the first particles, and the third color filter includes third particles different from the first particles and the second particles.

20. The organic light emitting display device of claim 19, wherein the colored particles include at least one type of particles among the first to third particles.

\* \* \* \* \*